United States Patent [19]
Waki et al.

[11] Patent Number: 5,984,699
[45] Date of Patent: Nov. 16, 1999

[54] METHOD OF FABRICATING A SEMICONDUCTOR DEVICE

[75] Inventors: Masaki Waki; Katsuhiro Hayashida; Mitsutaka Sato; Tadashi Uno; Kazuhiko Mitobe; Tetsuya Fujisawa, all of Kawasaki, Japan

[73] Assignee: Fujitsu Limited, Kawasaki, Japan

[21] Appl. No.: 08/790,982

[22] Filed: Jan. 29, 1997

[30] Foreign Application Priority Data

Jan. 29, 1996 [JP] Japan ................................ 8-013353
Nov. 5, 1996 [JP] Japan ................................ 8-293002

[51] Int. Cl.⁶ ........................................... H01L 21/44
[52] U.S. Cl. ........................... 439/123; 439/111; 439/118
[58] Field of Search ................................ 439/111, 112, 439/123, 124, 125, 126, 127, 118

[56] References Cited

U.S. PATENT DOCUMENTS

| | | | |
|---|---|---|---|
| 4,994,411 | 2/1991 | Naito et al. | 438/123 |
| 5,070,039 | 12/1991 | Johnson et al. | 438/123 |
| 5,278,101 | 1/1994 | Ikenoue | 438/123 |
| 5,612,259 | 3/1997 | Okutomo et al. | 438/123 |
| 5,693,573 | 12/1997 | Choi | 438/123 |

FOREIGN PATENT DOCUMENTS 6-140542 5/1994 Japan .
7-86490 3/1995 Japan .

*Primary Examiner*—Kevin M. Picardat
*Attorney, Agent, or Firm*—Nikaido, Marmelstein, Murray & Oram LLP

[57] ABSTRACT

A lead frame is formed by subjecting a frame base to a forming process, a semiconductor chip is fixed on leads formed in the lead frame and wires are provided in the semiconductor chip, and then a package which accommodates the semiconductor chip is formed; a non-conductive adhesive being provided, before the forming process, on a position on the frame base in which the leads are formed, and unnecessary portions of the frame base and the non-conductive adhesive being removed in the forming process so that the leads having a predetermined configuration and provided with the non-conductive adhesive are formed.

11 Claims, 29 Drawing Sheets

RPIOR ART

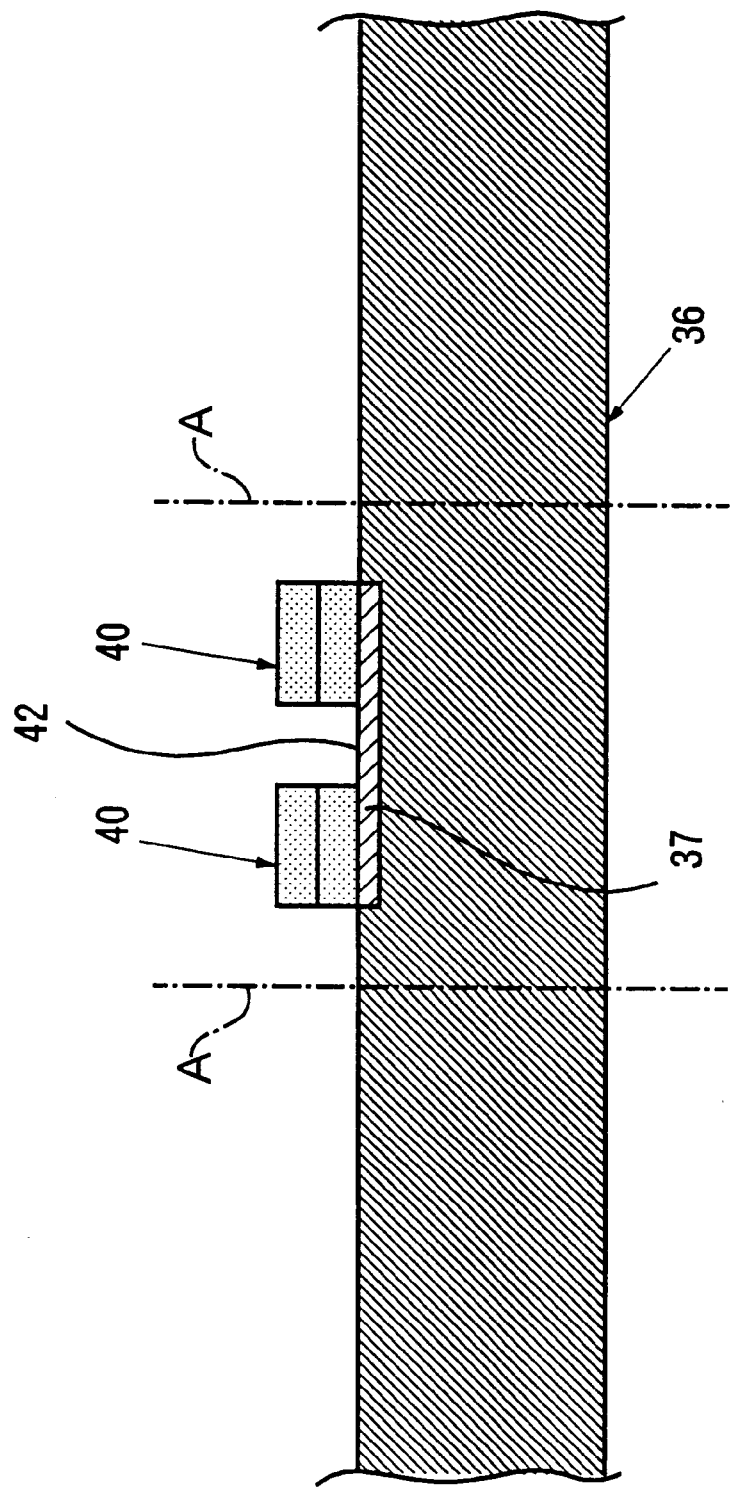

METHOD OF FABRICATING A SEMICONDUCTOR DEVICE

BACKGROUND OF THE INVENTION

1. Field of the Invention

The present invention generally relates to a method of fabricating a semiconductor device and, more particularly, to a method of fabricating a semiconductor device having a Lead On Chip (LOC) construction.

Recently, in association with the high performance and high density of semiconductor devices, the chip size of a semiconductor device is increasing. Therefore, a significantly high level of fabrication technology is required in order to meet a demand for a small package size.

In this background, a semiconductor device having a Lead On Chip (LOC) construction is proposed. In a LOC semiconductor device, leads are provided on a semiconductor chip. Since such a construction allows the leads to overlap the semiconductor device in a top view, the size of a semiconductor device can be reduced.

In the semiconductor device having the LOC construction, the semiconductor chip is fixed on the leads using an adhesive. Thus, it is necessary to apply the adhesive to the leads with precision.

A second aspect of the semiconductor device having the LOC construction is that, as semiconductor devices are built with increasingly high density of constituting elements, increasingly minute formation of a circuit on the semiconductor chip is required. Accordingly, that area (hereinafter, referred to as a circuit area) on the semiconductor chip on which a circuit is formed is exposed to effects such as an external stress.

this reason, a protective film is formed on a circuit area of the semiconductor chip. For proper protection of the circuit area, a high-quality protective film forming technology is required.

2. Description of the Related Art

Conventionally, the fabrication method described below has been employed to manufacture a semiconductor device having the LOC construction.

First, a lead frame having leads is produced by blanking such that a flat base formed of a material suitable for a lead frame is cut appropriately. Subsequently, a non-conductive adhesive which also serves as a protective film is provided on leads formed in the lead frame. The semiconductor chip is secured on the leads using the non-conductive adhesive. Wiring is then done according to a predetermined design, a package is produced and the semiconductor chip is sealed. This completes a process for fabricating a semiconductor device.

Two methods described below have generally been used to provide the non-conductive adhesive on the leads.

One of the methods is film pasting. FIG. 1A shows a sheet of adhesive film 1 (protective film) formed of a non-conductive adhesive. As shown in FIG. 1B, the adhesive film 1 is die-cut to a predetermined size that corresponds to an area of a lead frame.

In a process separate from the process of cutting the adhesive film 1, a lead frame 2 having leads 3 is produced by blanking such that a base is cut appropriately. As shown in FIG. 2, the cut adhesive film 1 is fitted adhesively on the leads 3 of the lead frame 2. As a result of the process described above, the adhesive film 1 is properly provided on the leads 3.

The other of the methods that have generally been used to provide the non-conductive adhesive on the leads is printing. In the printing of the non-conductive adhesive, the lead frame 2 having the leads 3 is first produced by blanking such that a base is cut to an appropriate size. Subsequently, a mask 4 is provided on the lead frame 2 having the leads 3, whereupon, as shown in FIG. 3, a non-conductive adhesive 6 (hereinafter, simply referred to as an adhesive) which also serves as a protective film is printed on the lead frame 2 using a squeegee 5.

As shown in FIG. 4, openings 7 are formed in the mask 4 at positions that correspond to the positions of the leads 3. Accordingly, as shown in FIG. 5, by printing the adhesive 6 using the mask 4, the adhesive 6 is properly provided on the leads 3.

While FIGS. 1 through 5 show the non-conductive adhesive 6 provided on the leads 3, it is also possible to provide the non-conductive adhesive (protective film) 6 on the semiconductor chip.

FIGS. 6 and 7 show how a protective film 6b is provided on a semiconductor chip 8; and FIG. 8 shows a semiconductor device 9 fabricated by the method of FIGS. 6 and 7. In FIGS. 6 through 8, those components that correspond to the components of FIGS. 1 through 5 are designated by the same reference numerals.

The printing method as described with reference to FIG. 3 is employed in order to provide the protective film 6b on the semiconductor chip 8. In this printing method, the mask 4 is provided on the semiconductor chip 8 (which may be in a wafer state). Subsequently, as shown in FIG. 6, a protective film material 6a which forms the protective film 6b is printed on the semiconductor chip 8 using the squeegee 5.

The openings 7 are formed on the mask 4 at positions that correspond to a circuit area formed on the upper surface of the semiconductor chip 8. Therefore, as shown in FIG. 7, by printing the protective film material 6a using the mask 4 and then causing the protective film material 6a to be hardened, the protective film 6b is formed on the circuit area on the semiconductor chip 8.

As shown in FIG. 8, the semiconductor device 9 fabricated by the method of FIGS. 6 and 7 is constructed such that the semiconductor chip 8 is encapsulated in a resin package 9a. Generally, a filler is mixed in the resin package 9a.

If the protective film 6b is not formed on the semiconductor chip 8, the filler collides against the circuit area on the semiconductor chip 8, when the package is formed, thus causing a damage on the circuit formed by the microfabrication technology. Provision of the protective film 6b ensures that the circuit area on the semiconductor chip 8 is protected and prevents an unfavorable effect caused by the filler from occurring.

However, in the film pasting described above, a plurality of dies for die-cutting the adhesive film 1 are required because the adhesive films 1 having different shapes should be prepared for different lead patterns formed in the lead frame. Therefore, the film pasting method has a drawback in that it is not a general-purpose method and the cost of dies is relatively high.

When the adhesive film 1 is die-cut, waste adhesive films are produced however efficient the die-cutting process may be. The adhesive film 1 is formed of a polyimide and is relatively expensive. Therefore, wasting of the adhesive film 1 causes the cost of the product to increase.

In the printing method, the mask 4 is required for each of the lead patterns. Further, the printing method has a drawback in that, in case the lead pattern is complex or has a small pitch, bridging of the adhesive 6 or invasion thereof into the back of a lead may occur, thus preventing a subsequent wiring process and a package forming process from being performed properly.

Still another problem with the conventional printing method is that it is necessary to apply a pressure on the squeegee 5 while it is being moved on the mask 4. A pressure from the squeegee 5 is transmitted to the semiconductor chip 8. Therefore, the circuit area on the semiconductor chip 8 is scraped by the squeegee 5 via the mask 4, thus causing a stress to be built up in the circuit area. As a result, the circuit surface may be damaged even before the non-conductive adhesive 6 or the protective film 6b is formed.

Another problem with the semiconductor device having the LOC construction fabricated by the conventional method is that, since the leads 3 are provided above the circuit area, the leads 3 may come in contact with the circuit area when the leads 3 are joined with the semiconductor chip 8, thus causing a damage on the circuit area.

SUMMARY OF THE INVENTION

Accordingly, a general object of the present invention is to provide a method of fabricating a semiconductor device in which the aforementioned drawbacks and problems are eliminated.

Another and more specific object of the present invention is to provide a method of fabricating a semiconductor device in which the cost of a product is reduced and the yield is improved.

In order to achieve the above-mentioned objects, the present invention provides a method of fabricating a semiconductor device comprising the steps of: forming a lead frame by subjecting a base to a forming process; fixing a semiconductor chip on leads formed in the lead frame and providing wires in the semiconductor chip; and forming a package which accommodates the semiconductor chip, wherein a non-conductive adhesive is provided, before said forming process, on a position on said base in which the leads are formed, and unnecessary portions of said base and said non-conductive adhesive are removed in the forming process so that the leads having a predetermined configuration and provided with said non-conductive adhesive are formed.

Preferably, the unnecessary portions of the base are removed by one of a pressing process and an etching process.

According to the method of fabricating a semiconductor device of the present invention, there is no strict requirement for precision with which a non-conductive adhesive should be provided. Therefore, it is possible to provide a non-conductive adhesive without using a high-precision mask so that a general-purpose method of providing the adhesive is obtained and the product cost is reduced.

In a preferred embodiment of the present invention, the non-conductive adhesive is provided in a position in which ends of the leads are formed so that the adhesive remains selectively on the ends of the leads after the leads have been formed.

According to this aspect of the present invention, it is possible to prevent a non-conductive adhesive from being formed in unnecessary portions. Therefore, bridging of the non-conductive adhesive or invasion thereof into the back of leads are prevented so that a subsequent wiring process and a package forming process are performed properly.

The aforementioned objects can also be achieved by a method of fabricating a semiconductor device comprising the steps of: forming a lead frame by subjecting a base to a forming process; fixing a semiconductor chip on leads formed in the lead frame and providing wires in the semiconductor chip; and forming a package which accommodates the semiconductor chip, wherein a protective film is formed at least in a circuit area of the semiconductor chip on which a circuit is formed, and, subsequently, the semiconductor chip is fixed to the leads via the protective film.

According to this aspect of the present invention, leads are prevented from accidentally coming into contact with a circuit area on a semiconductor chip when the semiconductor chip is joined with the leads. Thus, the yield of the semiconductor fabrication is improved.

In a preferred embodiment of the present invention, the protective film is formed by a method comprising the steps of: forming, on the circuit area on the semiconductor chip, a mask provided with openings that correspond to the circuit area; providing liquefied protective film material in the openings provided in the mask; forming the protective film by hardening the protective film material; and removing the mask from the semiconductor chip.

According to this aspect of the present invention, a protective film can be formed by dropping a liquefied protective film material, that is, without using a jig such as a squeegee which may cause a stress in a circuit area. Accordingly, the circuit area is properly prevented from being damaged when the protective film is formed.

The mask may be a multilayer mask comprising a base film, an adhesive layer, a separator film arranged in a stated order from a top.

According to this aspect of the present invention, a protective film can be provided while a mask is being adhesively attached to a semiconductor chip so that the mask is prevented from deviated from its position while the protective film is being formed. In this way, the protective film can be formed with a high precision.

The protective film material may be provided in the openings using one of a dispenser and a spray.

According to this aspect of the present invention, it is possible to provide a protective film material without causing a stress in a circuit area so that the circuit area is prevented from suffering a damage.

The mask may be made to travel from a supply reel to a take-up reel, and following three processes may be performed sequentially, a) a process for providing the liquefied protective film material in the openings as the mask travels; b) a process for forming the protective film; and c) a process of removing the mask from the semiconductor chip.

According to this aspect of the present invention, it is possible to fabricate a semiconductor device efficiently.

The aforementioned objects can also be achieved by a method of fabricating a semiconductor device comprising the steps of: forming a lead frame by subjecting a base to a forming process; fixing a semiconductor chip on leads formed in the lead frame and providing wires in the semiconductor chip; and forming a package which accommodates the semiconductor chip, wherein a protective film is formed at least in an area of the leads which faces the semiconductor chip and, subsequently, the semiconductor chip is fixed to the leads via the protective film.

According to this method, leads are prevented from accidentally coming into contact with a circuit area on a semiconductor chip when the semiconductor chip is joined with the leads. Accordingly, the yield of the semiconductor fabrication can be improved.

In another preferred embodiment, the protective film is provided on the leads by steeping the leads in a protective film material tank filled by a liquefied protective film material.

According to this aspect of the present invention, a protective film can be provided on leads in a simple process whereby the leads are steeped in a protective film material tank. Thus, a process of forming the protective film can be simplified.

In still another preferred embodiment, a down-setting part is provided in each of the leads so that the protective film is formed in the down-setting part.

According to this aspect of the present invention, a protective film may be formed only on a down-setting part. Thus, the volume of the protective film material used can be reduced, and a semiconductor chip can be secured on the leads properly.

BRIEF DESCRIPTION OF THE DRAWINGS

Other objects and further features of the present invention will be apparent from the following detailed description when read in conjunction with the accompanying drawings, in which:

FIG. 21 shows a state in which a mask is peeled from a wafer;

DESCRIPTION OF THE PREFERRED EMBODIMENTS

FIGS. 9 through 15 show methods of fabricating a semiconductor device according to a first embodiment of the present invention. Before going into a description of a fabricating method of the first embodiment, a description of a construction of a semiconductor device 10 fabricated by the method of the first embodiment is given.

Figure 16:
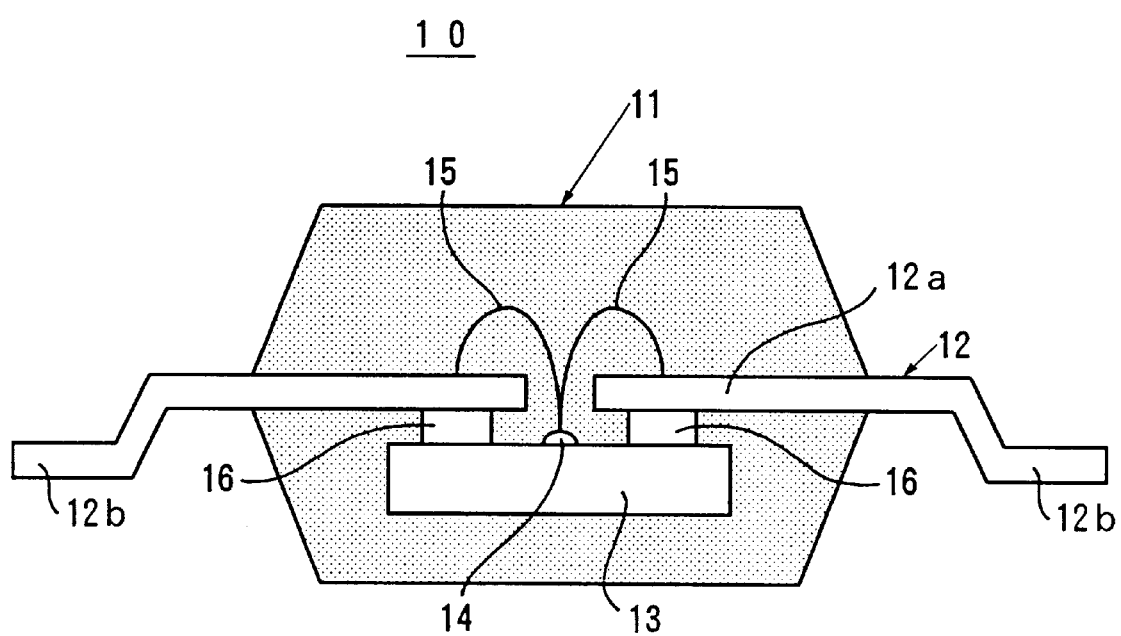
FIG. 16 is a sectional view of a semiconductor device fabricated by a method according to the first embodiment.

FIG. 16 is a sectional view of the semiconductor device 10 fabricated by the method of the first embodiment. A resin package 11 is formed by molding, for example. Leads 12, a semiconductor chip 12 and the like are accommodated in the resin package 11.

Each of the leads 12 is composed of an inner lead 12a and an outer lead 12b. The inner lead 12a is embedded in the resin package 11 so that the each of the leads 12 is firmly accommodated to the resin package 11.

A wire 15 is provided between the inner lead 12a and an electrode pad 14 of the semiconductor chip 13 so as to establish an electrical connection between the corresponding lead 12 and the semiconductor chip 13. The outer lead 12b extends outside the resin package 11 and is bent in a predetermined configuration (a gull-wing configuration according to the first embodiment).

The semiconductor device 10 according to the first embodiment has the LOC construction such that the inner lead 12a of each of the leads 12 extends over the upper major surface of the semiconductor chip 13. A non-conductive adhesive 16 (hereinafter, simply referred to as an adhesive) is provided on that surface of the end of the inner lead 12a which faces the semiconductor chip 13. The adhesive 16 ensures that the semiconductor chip 13 is fixed to the leads 12.

Since the LOC construction of the semiconductor device 10 allows the inner lead 12a to overlap the semiconductor chip 13 in a top view, the size of the semiconductor device 10 is relatively small.

A description will now be given, with reference to FIGS. 9 through 16, of a method of fabricating the semiconductor device 10 having the above-described construction. Those components that are the same as the components of the construction shown in FIG. 16 are designated by the same reference numerals.

Figure 9:
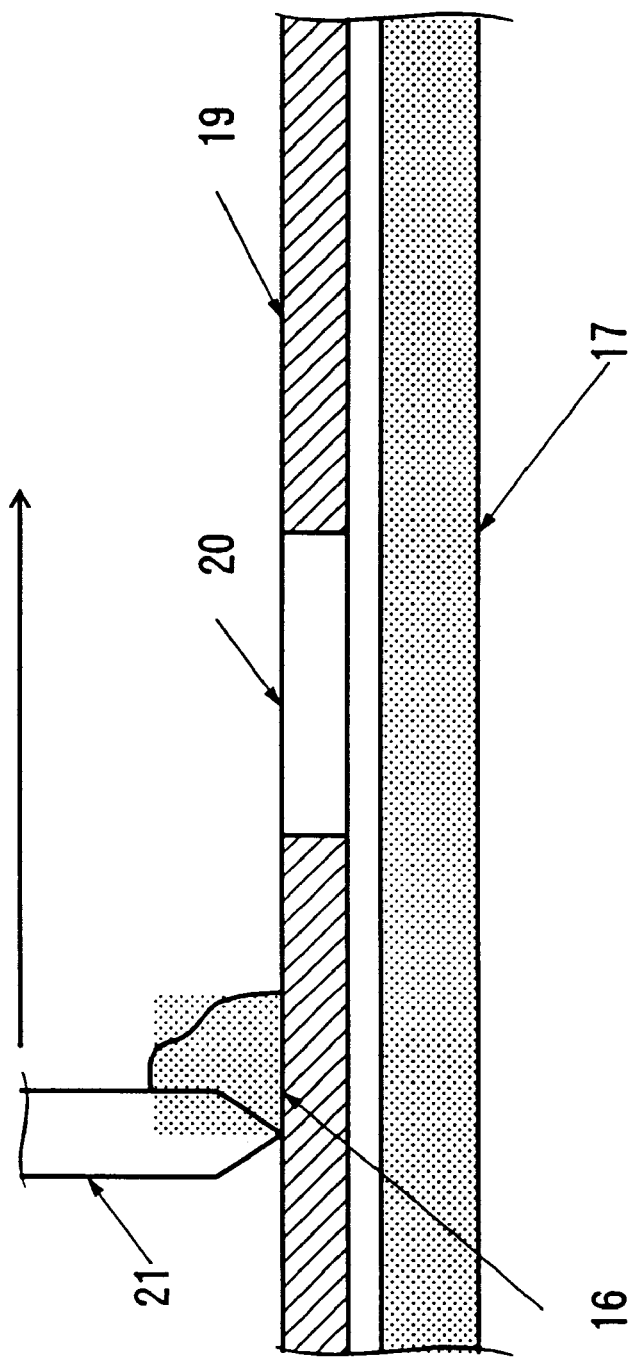
FIG. 9 illustrates how an adhesive is printed according to a first embodiment of the present invention.

In the fabrication of the semiconductor device 10, printing of the adhesive 16 is first performed. FIG. 9 illustrates how the adhesive 16 is printed. Referring to FIG. 9, by subjecting a frame base 17, which corresponds to the base of the earlier description, to processes described in the following, a lead frame 18 is formed.

In the printing process, the leads 12 have not been formed yet. Accordingly, the frame base 17 still has a flat configuration. Guide holes 12 are formed at the sides of the frame base 17 (see FIG. 10). The frame base 17 may be formed of a 42-alloy (an Fe-Ni alloy) or a copper alloy.

First, a mask 19 is provided on the frame base 17. An opening 20 is formed on a predetermined position of the mask 19. The position of the opening 20 is made to correspond to an area on the frame base 17 in which the leads 12 are formed. More specifically, the opening 20 is made to face ends of the leads 12 when the leads 12 are formed.

However, the opening 20 may not be formed with a precision. The opening 20 may be as large as or slightly larger than an area of the ends of the leads 12. Thus, the opening 20 has a rectangular shape that covers the ends of the leads 12. However, the shape of the opening 20 is not limited to the rectangular shape and may have another shape that corresponds to the pattern of the leads 12.

When the mask 19 has been provided on the frame base 17, the adhesive 16 is printed on the frame base 17 using a squeegee 21. The adhesive 16 may be a polyimide adhesive. The thickness of the mask 19 is controlled so that the thickness of the adhesive 16 on the frame base 17 is 10–30 μm.

Figure 10:
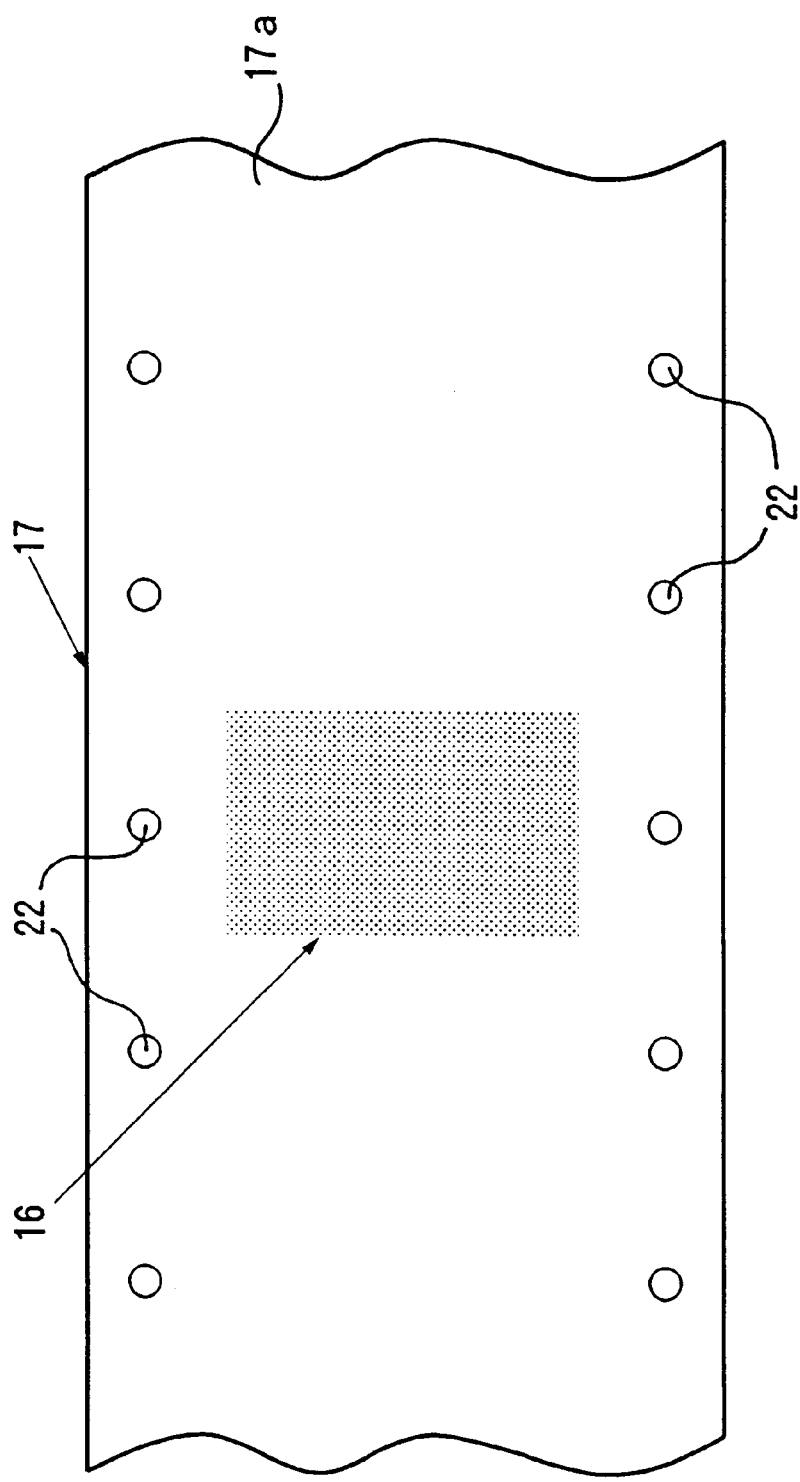
FIG. 10 shows a frame base obtained when a printing process according to the first embodiment is completed.

When the printing is completed, drying and hardening process for the adhesive 16 is conducted, thus ending the printing process. FIG. 10 shows the frame base 17 obtained when the printing process is completed. As shown in FIG. 10, the printing process results in the adhesive 16 being provided on a that portion of the frame base 17 in which the ends of the leads 12 are formed.

Subsequent to the printing process, a plating process is conducted. In the plating process, plating is performed on that surface (hereinafter, referred to as a second surface 17b) of the frame base 17 opposite to the surface (hereinafter, referred to as a first surface 17a) on which the adhesive 16 is printed.

The plating process is performed to ensure that the wire 15 and the corresponding lead 12 are firmly joined to each other in a wiring process described later. That is, since it is impossible to join the wire 15 which is formed of a gold with the lead 12 which is formed of a 42-alloy, a metal is plated in a wire-bonding position on each of the leads 12 so as to ensure a proper joint with the wire 15.

Figure 11:
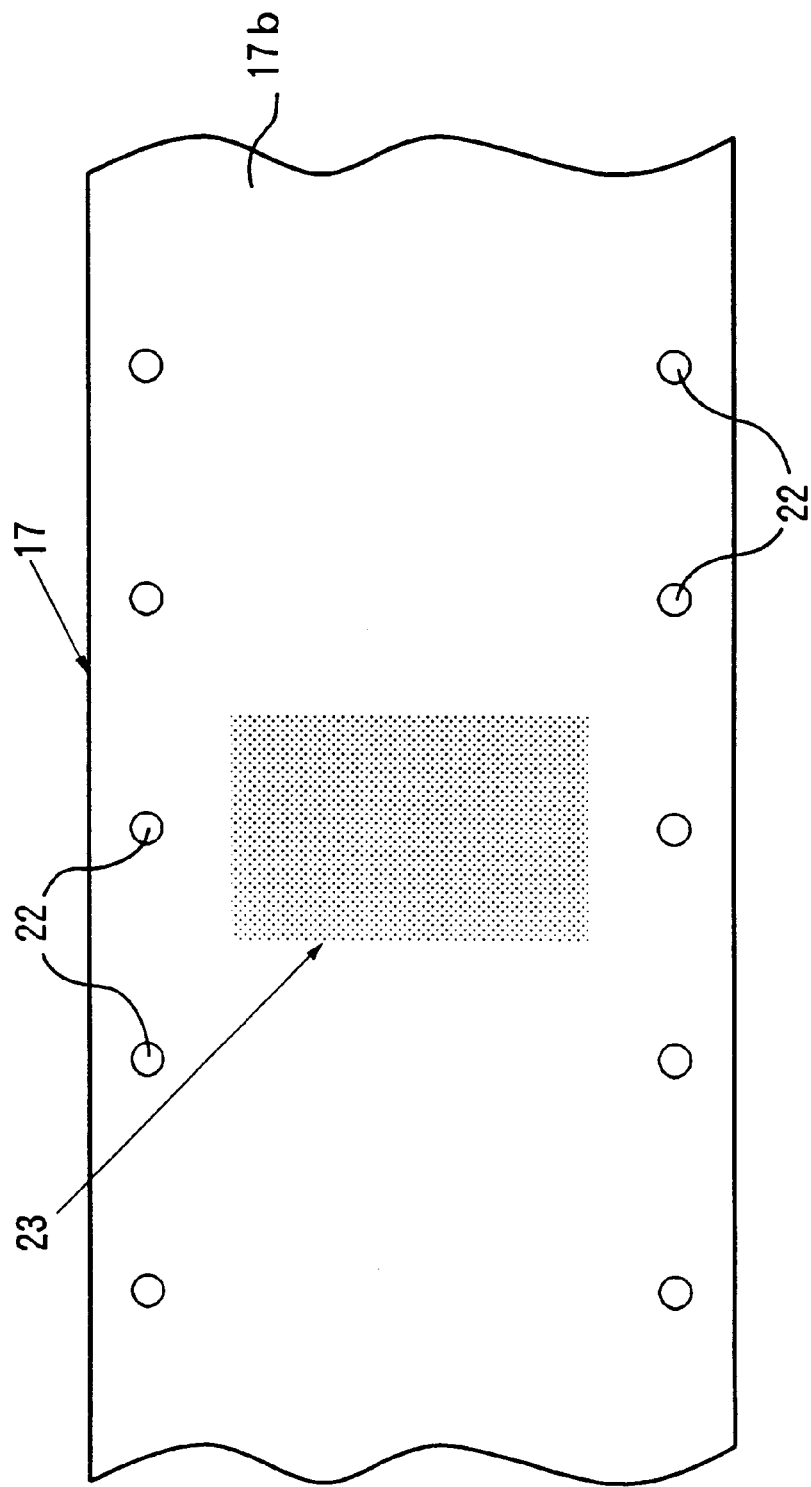
FIG. 11 shows how a silver (Ag) film is formed on a surface of a frame base according to the first embodiment.

In the first embodiment, silver (Ag) is used because of its capability to be joined properly both with the wire 15 and the corresponding lead 12 formed of a 42-alloy. As shown in FIG. 11, a silver (Ag) film 23 is formed on the second surface 17b of the frame base 17. Since the Ag film 23 should be formed on the wire-bonding position, the Ag film 23 is formed on a position that corresponds to the ends of the leads 12.

Figure 12:
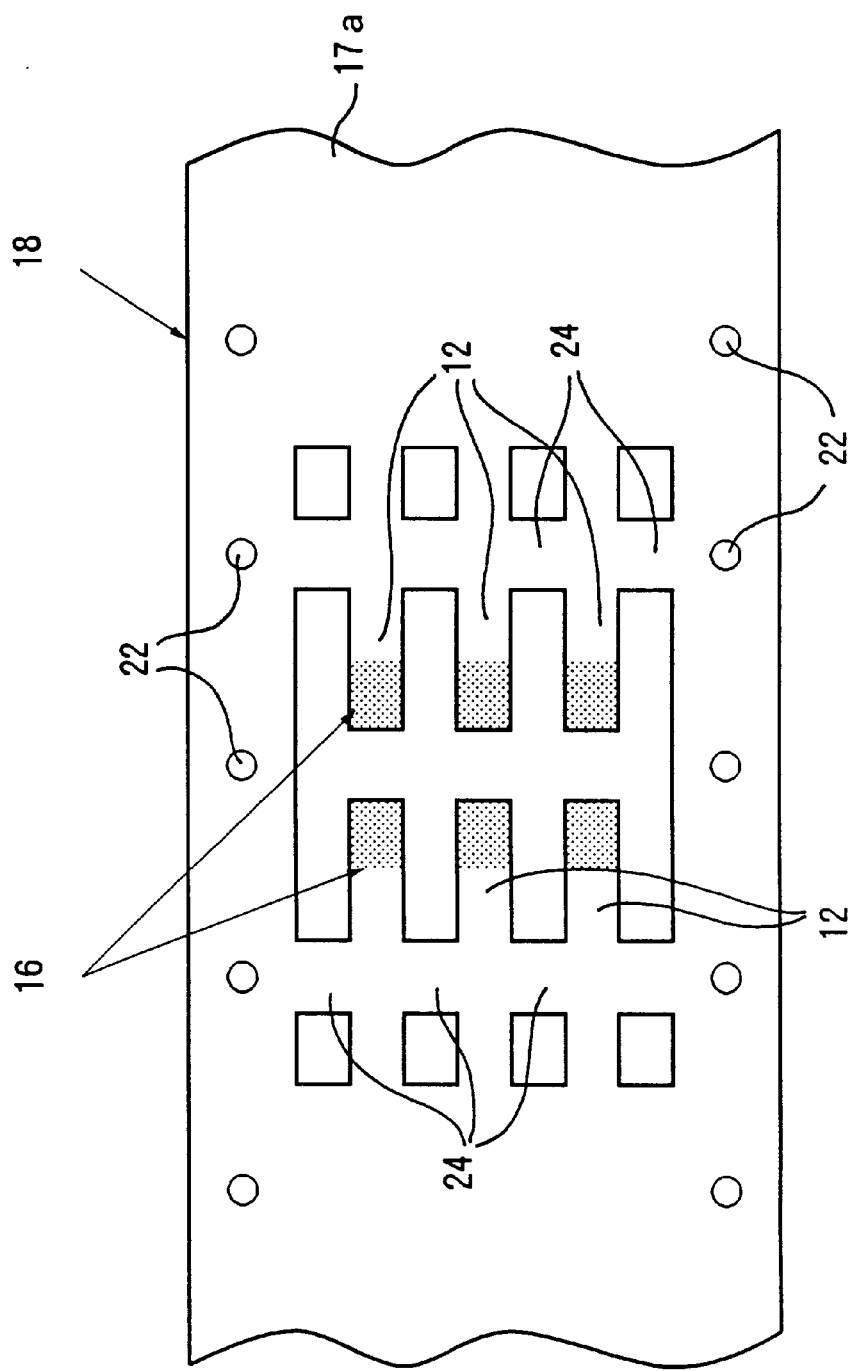
FIG. 12 shows how a lead frame provided with leads and tie bars is formed as a result of a punching according to the first embodiment.

When the plating process is completed, a forming process is conducted. In the forming process, the frame base 17 is punched using a lead frame die consisting of an upper die and a lower die. As shown in FIG. 12, as a result of the punching, the lead frame 18 provided with the leads 12 and tie bars 24 is formed.

Of particular note is the way that the leads 12 are formed as a result of the punching. As described earlier, the adhesive 16 is provided in a position on the frame base 17 on which the leads 12 are formed. Therefore, the adhesive 16 provided outside the leads 12 is removed as a result of unnecessary portions of the frame base 17 being removed by punching.

Figure 3:
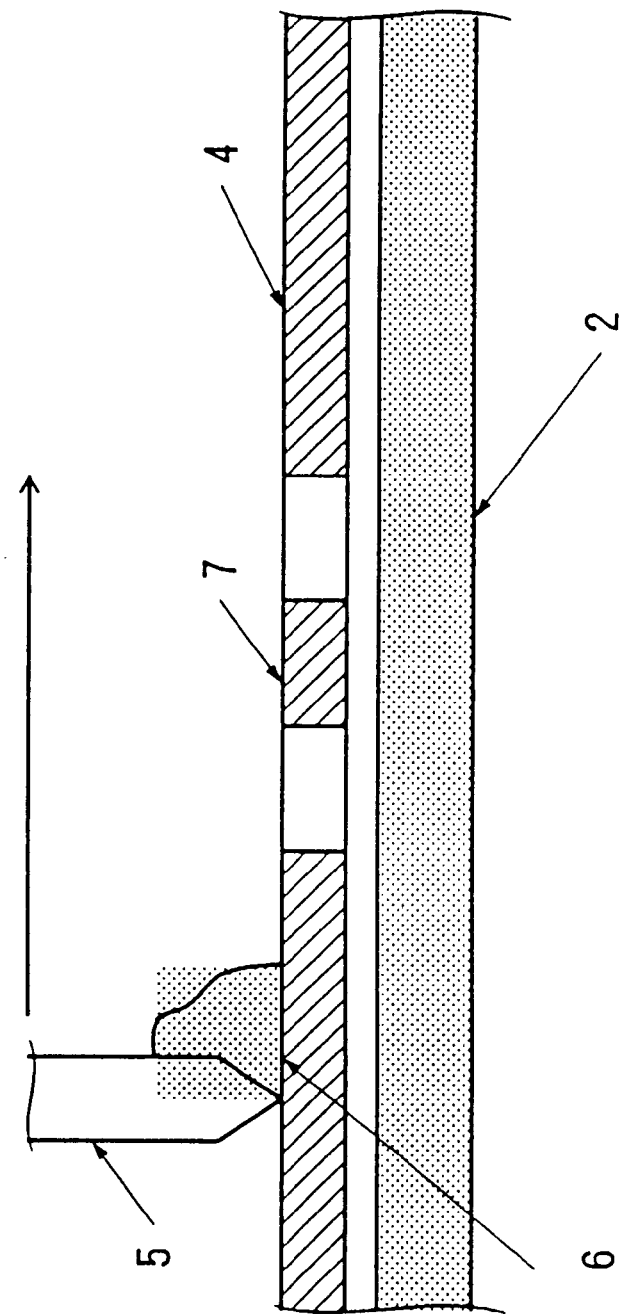
FIG. 3 shows how a mask is used to print an adhesive on a lead frame according to a related art.
Figure 4:
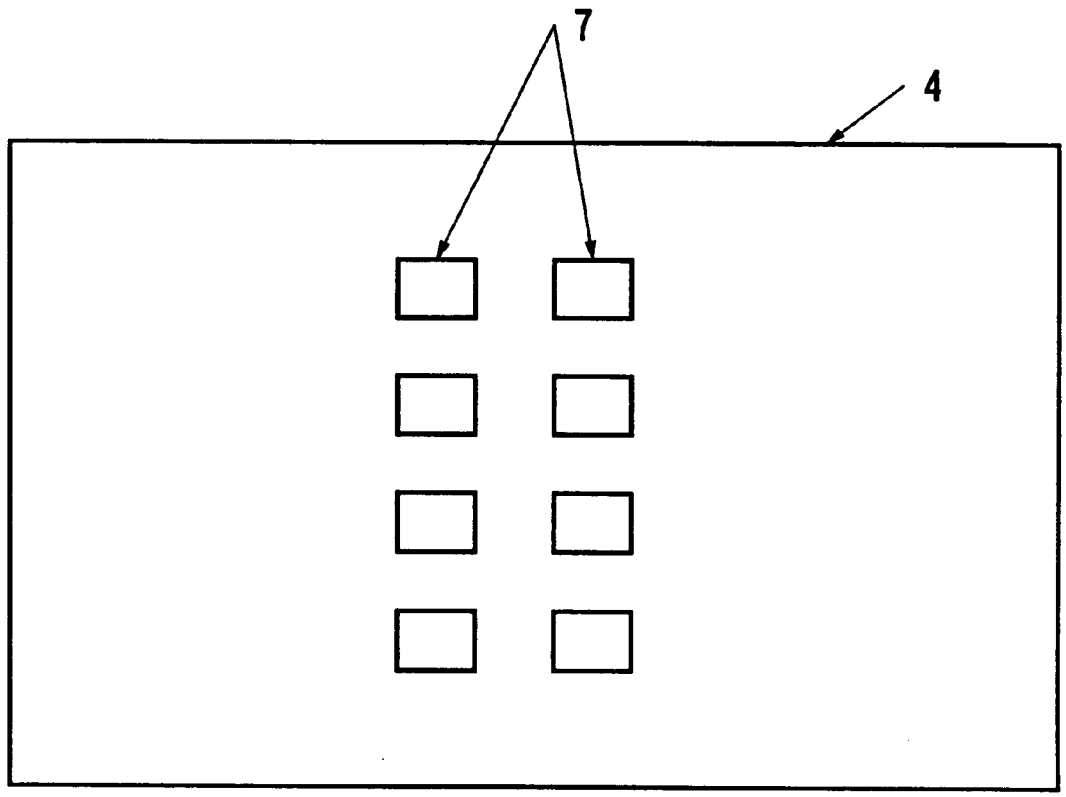
FIG. 4 shows how openings are formed in a mask at positions that correspond to the positions of leads according to a related art.
Figure 5:
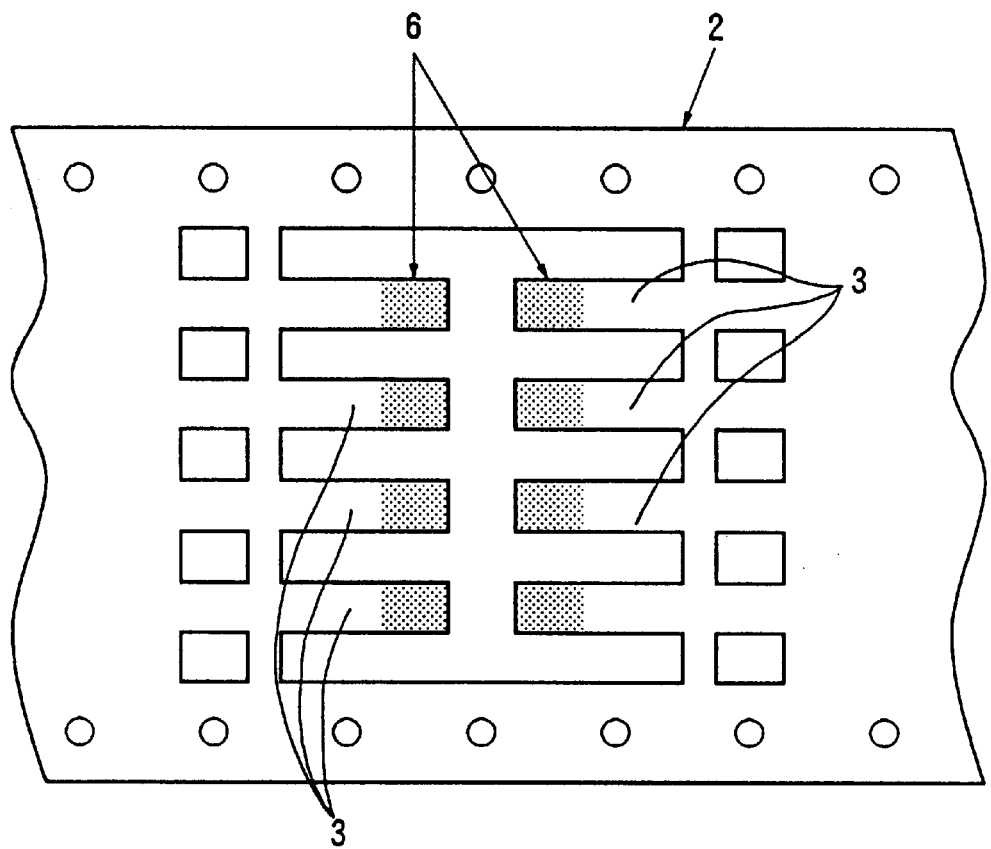
FIG. 5 shows how an adhesive is provided properly on leads using a mask according to a related art.
Figure 6:
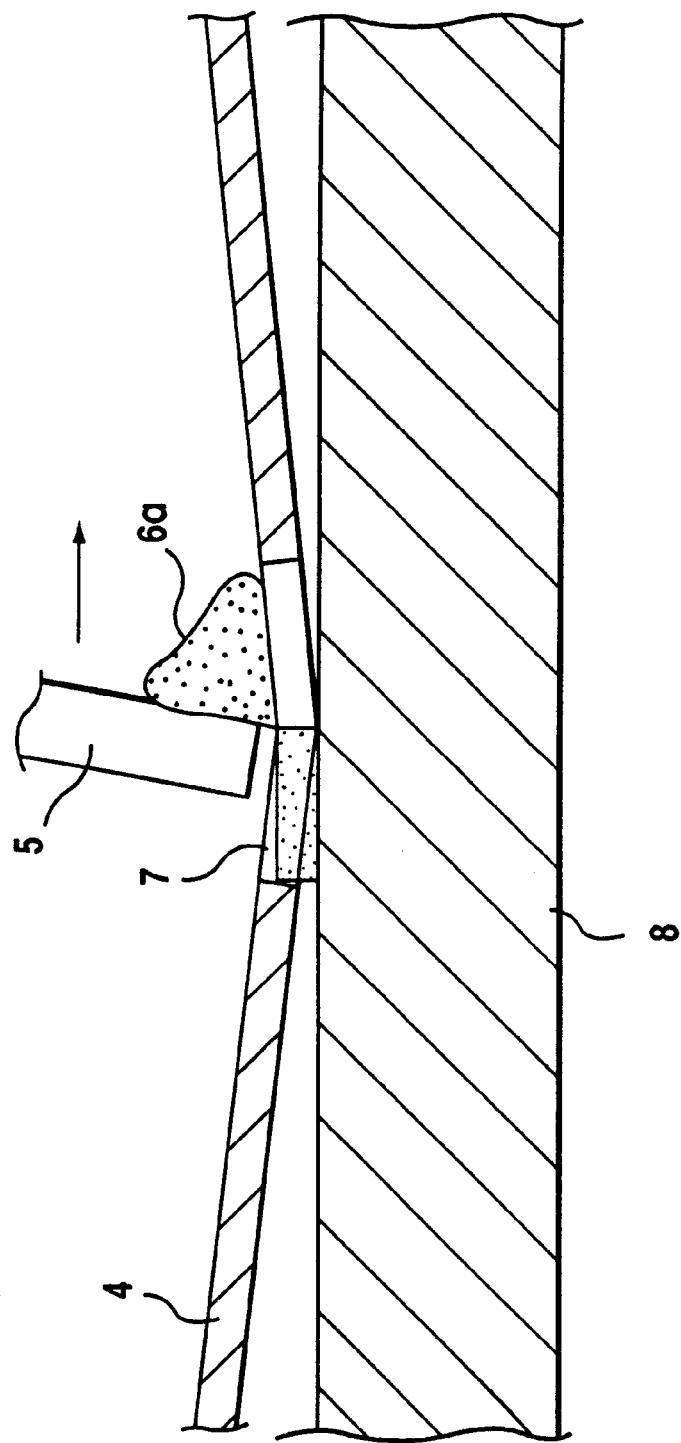
FIG. 6 shows how a protective film is printed on a semiconductor chip using a squeegee according to a related art.
Figure 7:
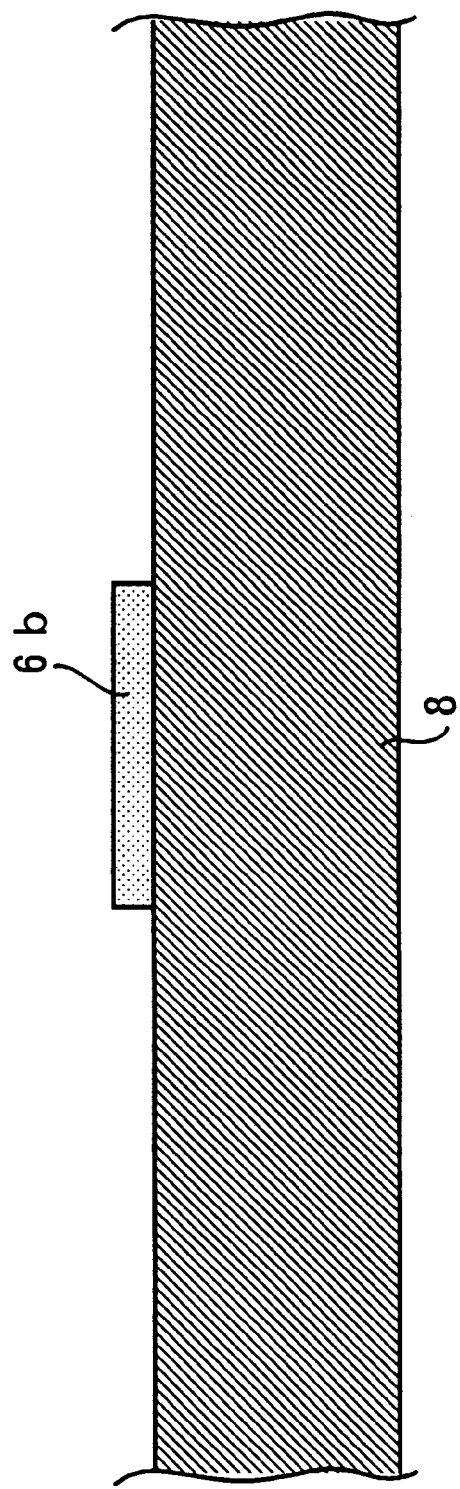
FIG. 7 shows a protective film formed on a semiconductor chip according to a related art.
Figure 8:
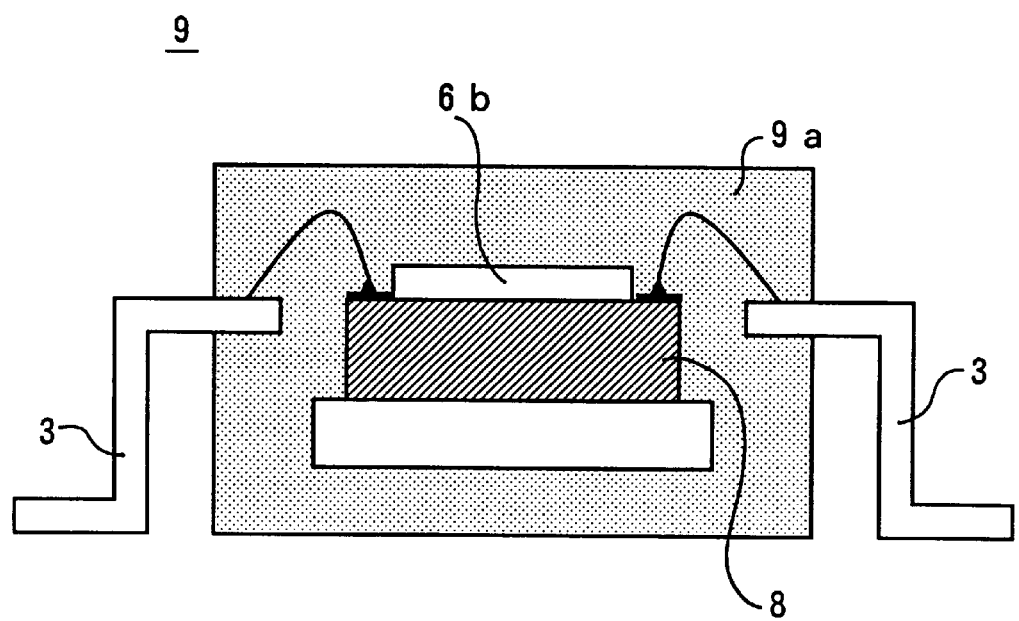
FIG. 8 shows a semiconductor device fabricated by the method of FIGS. 6 and 7.

Thus, the above described process for forming the lead frame 18 results in the adhesive 16 being selectively formed only at the ends of the leads 12. That is, by providing the adhesive 16 on that portion of the frame base 17 on which the leads 12 are formed, and by removing the unnecessary portions of the frame base 17 and the adhesive 16 in the forming process, no strict precision requirement is imposed in providing the adhesive 16. Therefore, the mask 19 used in providing the adhesive 16 may be produced with a lower precision than that of the mask 4 (see FIG. 3) used in the conventional printing method.

Figure 1A:
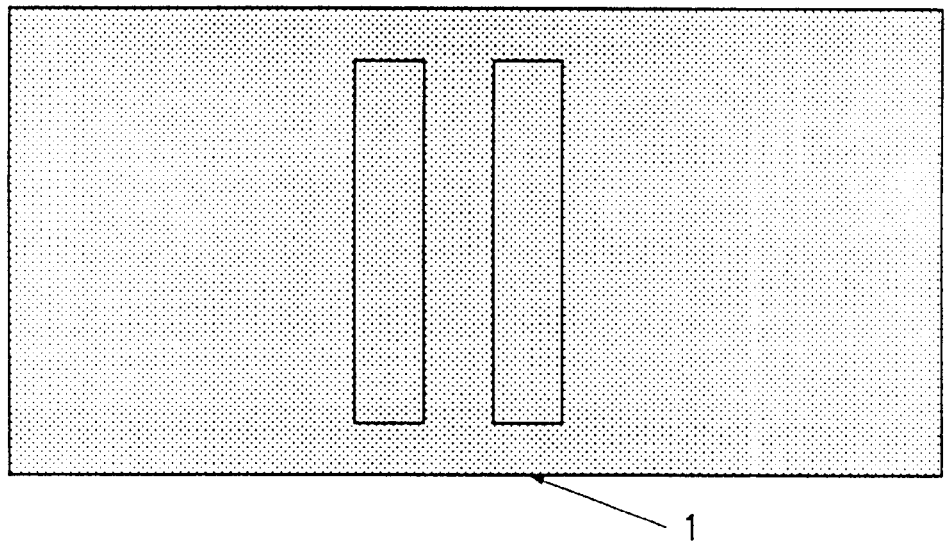
FIG. 1A shows a sheet of adhesive film formed of a non-conductive adhesive according to a related art.
Figure 1B:
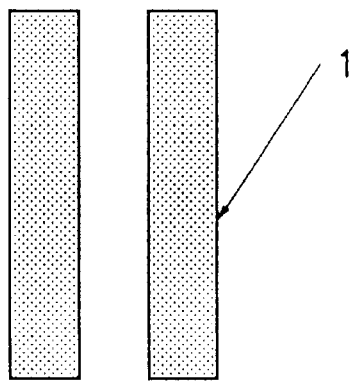
FIG. 1B shows how a sheet of adhesive film is die-cut to a predetermined size according to a related art.
Figure 2:
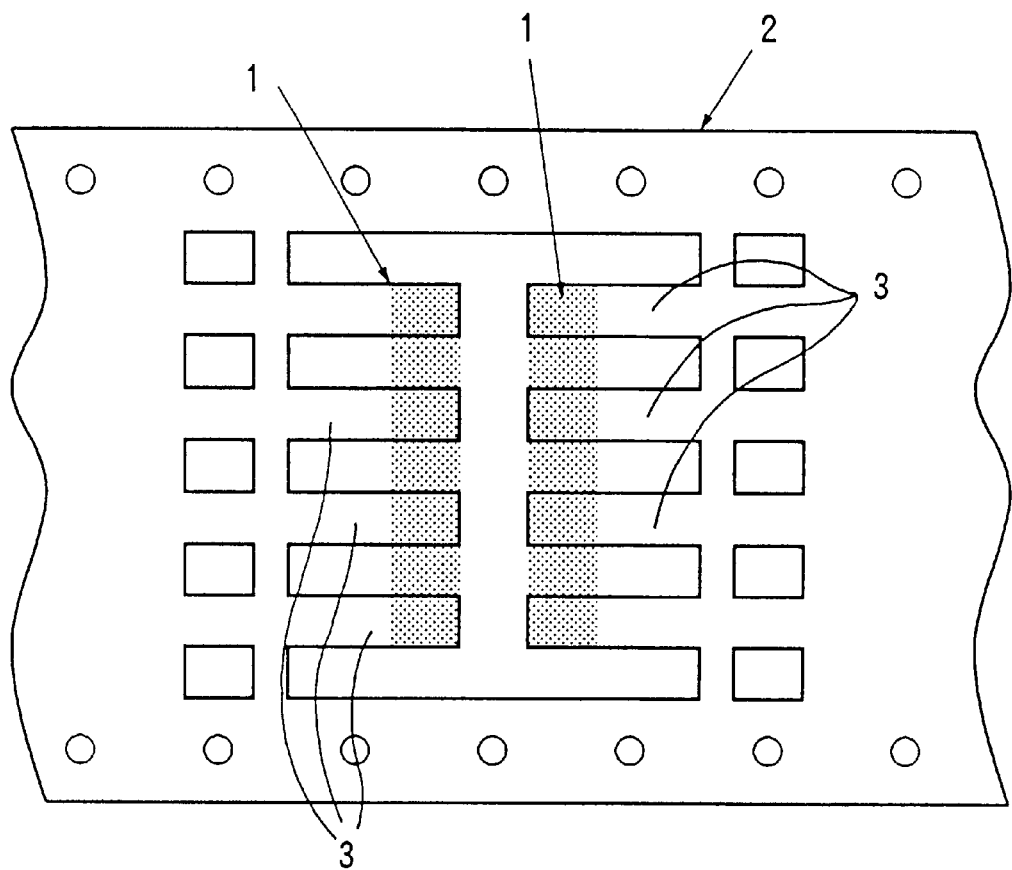
FIG. 2 shows how an adhesive film is fitted on leads of a lead frame according to a related art.

For the reason stated above, it is not necessary to change the mask depending on the lead pattern as is done in the conventional printing method. Therefore, the method according to the first embodiment described above is a general-purpose method and ensures that the product cost is reduced. Since the relatively expensive adhesive film 1 (see FIG. 2) used in the conventional film pasting is unnecessary, the first embodiment described above ensures that the product cost is reduced as compared to the conventional film pasting method.

Figure 13:
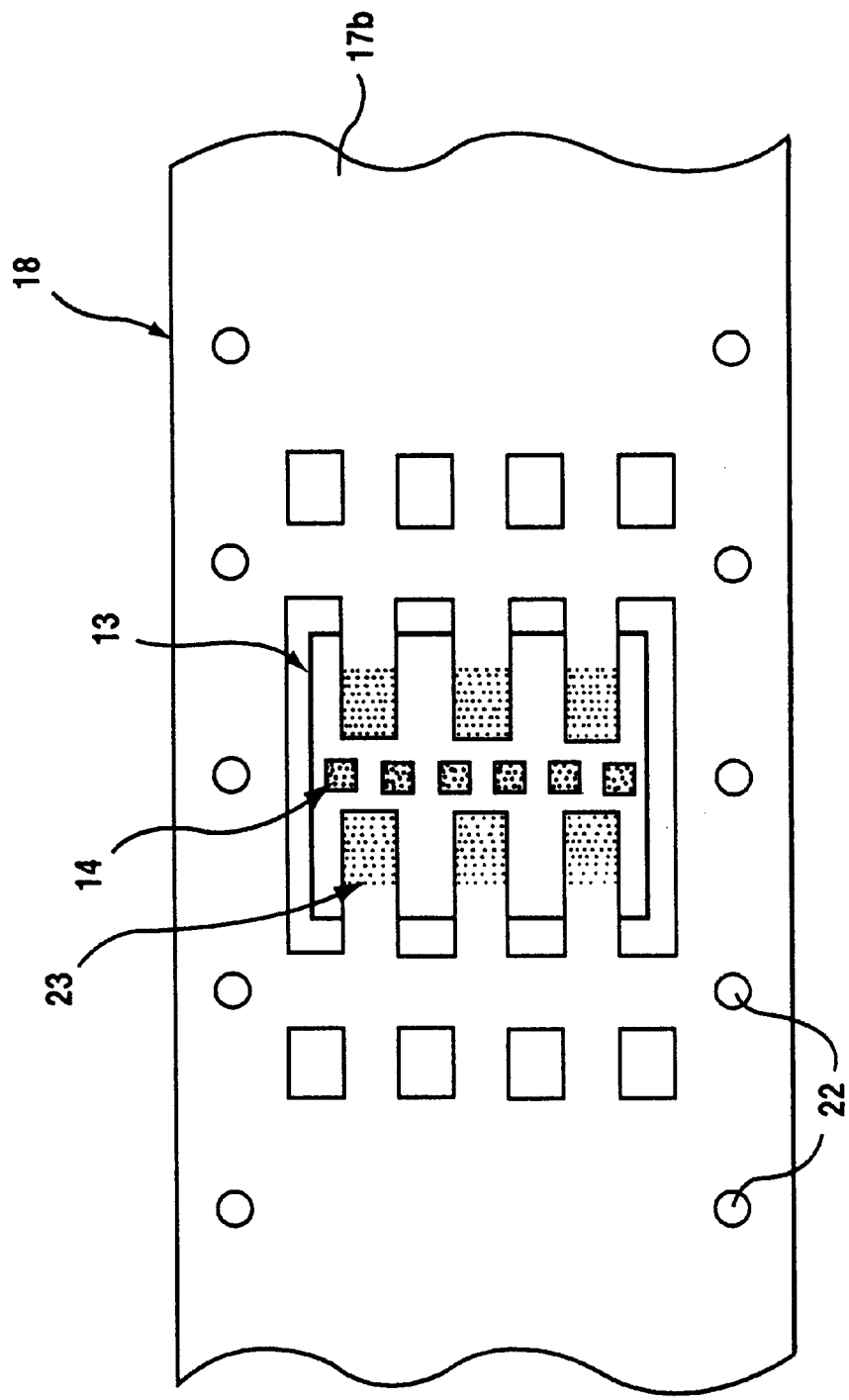
FIG. 13 shows a chip mounting process according to the first embodiment.

Subsequent to the forming of the lead frame 18, a chip mounting process is performed. As shown in FIG. 13, in the chip mounting process, the semiconductor chip 13 is attached adhesively on the leads 12 formed in the lead frame 18 via the adhesive 16.

By providing the adhesive 16 on a position that corresponds to the ends of the leads 12 so that the adhesive 16 selectively remains on the ends of the leads 12, the adhesive 16 is prevented from being formed in undesired portions. Thus, it is possible to prevent bridges of the adhesive 16 from occurring between adjacent leads 12 and also prevent the adhesive 16 from invading the back of the leads 12. As a result of this, a wiring process and a package forming process subsequent to the provision of the adhesive 16 can be properly performed so that the yield is improved.

Figure 14:
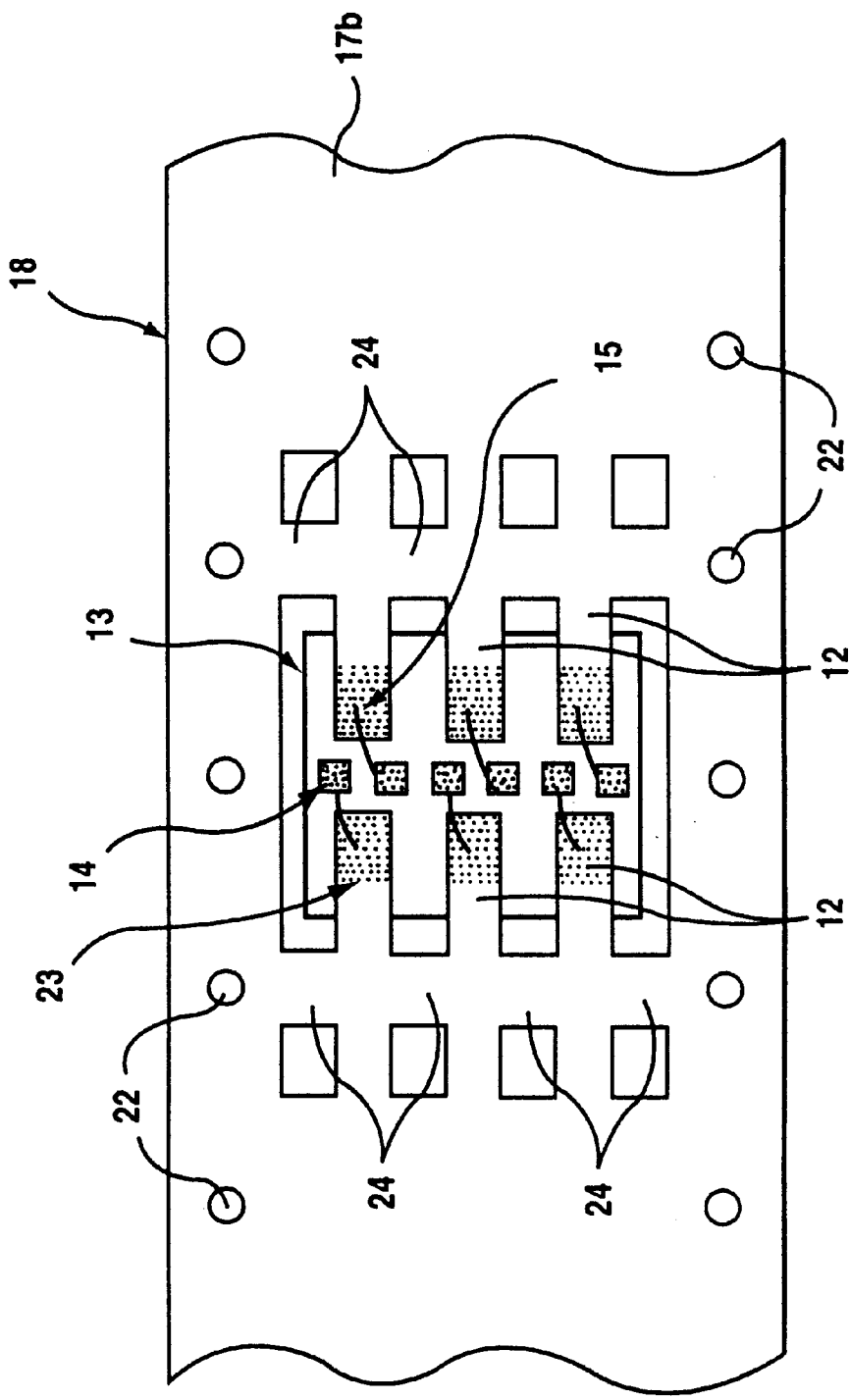
FIG. 14 shows a wiring process according to the first embodiment.

Subsequent to the chip mounting process, the wiring process is performed. As shown in FIG. 14, in the wiring process, wire bonding between the electrode pad 14 formed in the semiconductor chip 13 and the inner lead 12a is performed.

Since the Ag film 23 is formed in the inner lead 12a as described earlier, the wire 15 formed of a gold (Au) can be properly joined with the inner lead 12a.

Figure 15:
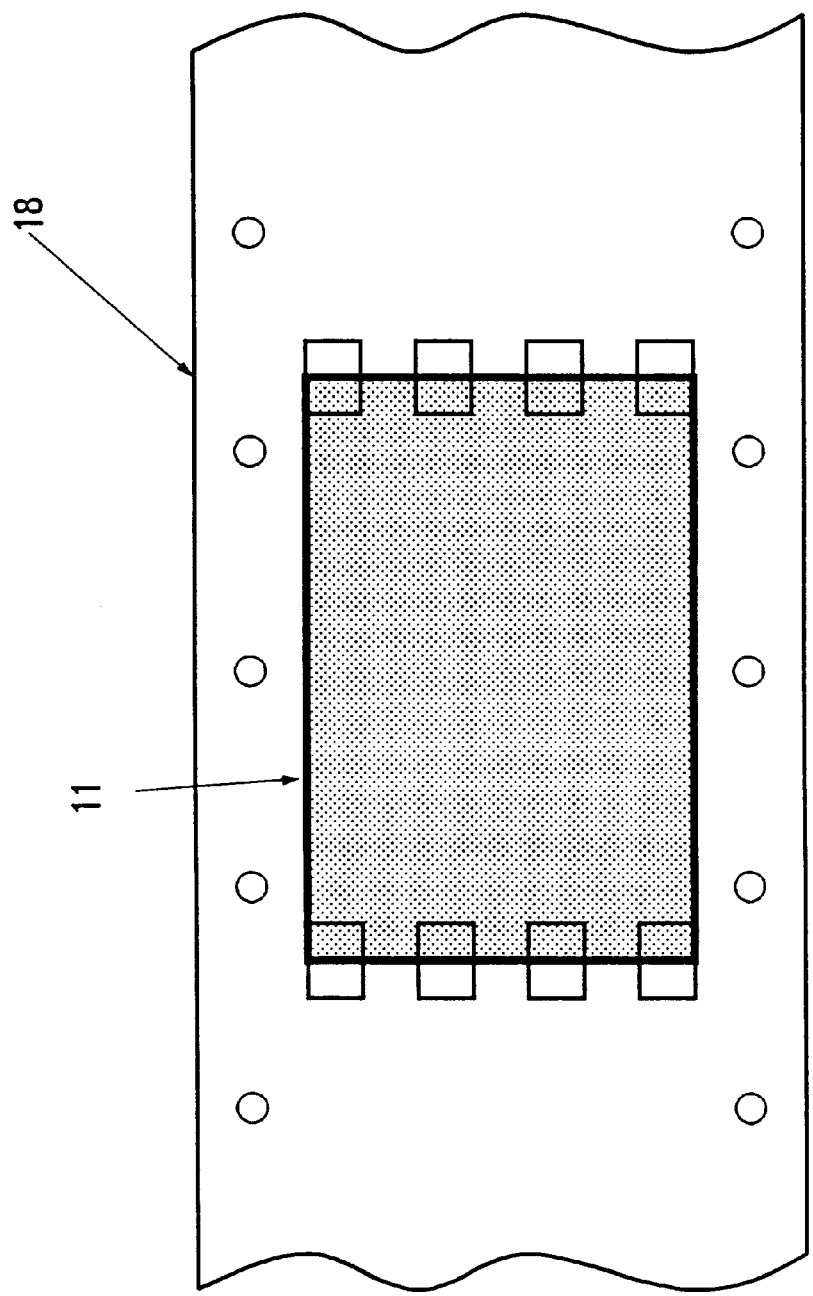
FIG. 15 shows a packaging process according to the first embodiment.

Subsequent to the wiring process, the package forming process is performed. As shown in FIG. 15, in the package forming process, a resin mold process is performed so that the resin package 11 is formed. Once the resin package 11 is formed, unnecessary portions of the lead frame 18 such as the tie bars 24 are removed and the outer lead 12b is bent to a predetermined configuration so that the semiconductor device 10 as shown in FIG. 16 is produced.

While it is assumed that the lead frame die is used to punch the frame base 17 in order to form the lead frame 18, other methods of forming the lead frame 18 may be employed. For example, etching may be employed so as to produce the lead frame 18.

When etching is employed, unnecessary portions of the adhesive 16 should be removed together with unnecessary portions of the frame base 17. For this reason, an etchant capable of resolving both the frame base 17 and the adhesive 16 must be selected. Dry etching may be employed instead of wet etching.

A description will now be given of a second embodiment of the present invention.

FIGS. 17 through 23 show a method of fabricating a semiconductor device according to the second embodiment. The fabricating method according to the second embodiment will now be described process by process. In FIGS. 17 through 23, those components that correspond to the components described in the first embodiment are designated by the same reference numerals.

A unique feature of the semiconductor device fabricated according to the second embodiment is that a protective film 40 is formed on a circuit area 37 formed on the upper surface of a semiconductor chip 43. Since the fabricating method according to the second embodiment also features the formation of the protective film 40, the description is given below focusing on the formation of the protective film 40.

Figure 17:
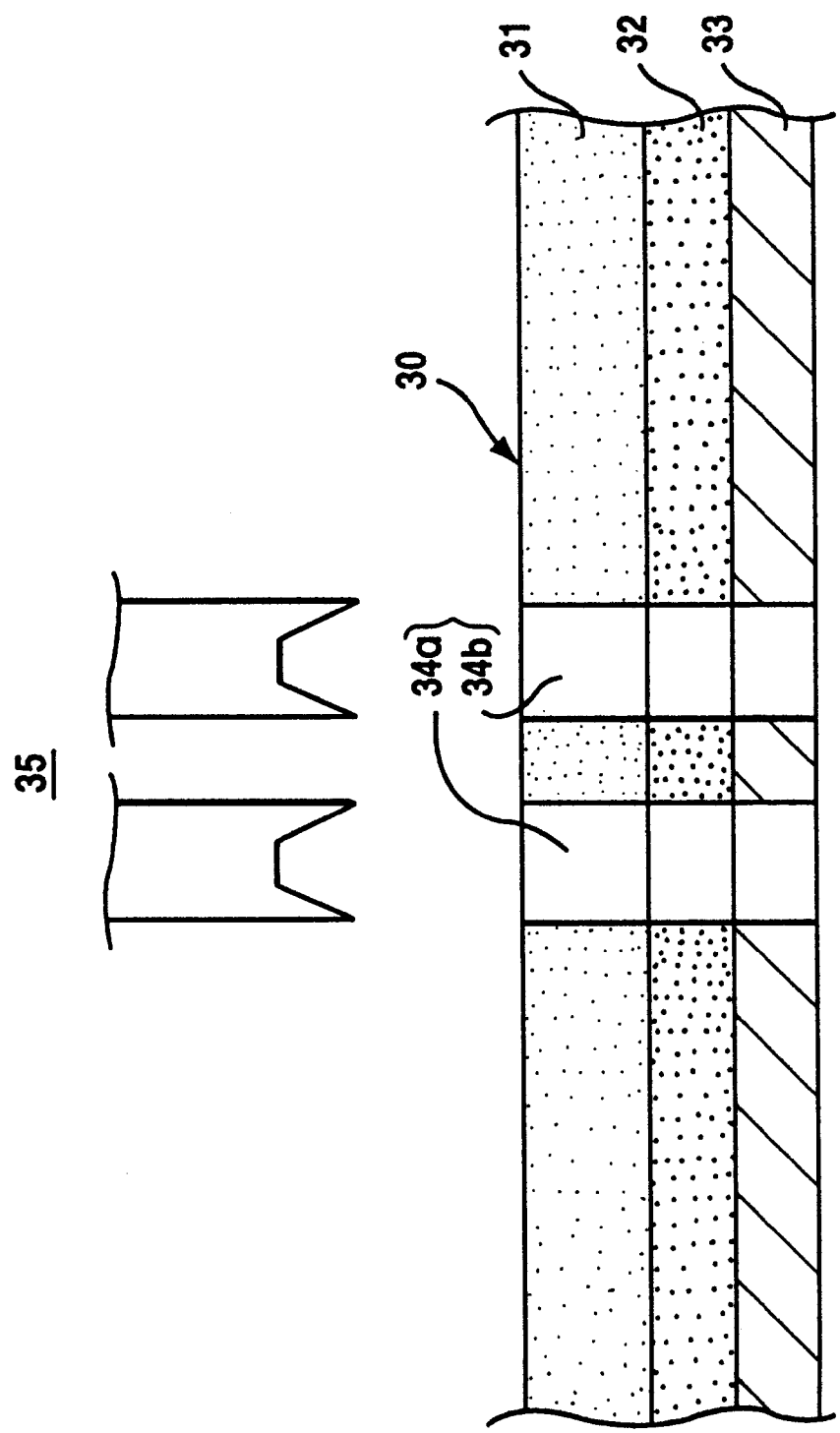
FIG. 17 shows how a mask is formed according to a second embodiment of the present invention.

In the fabricating method according to the second embodiment, a mask 30 is formed first. FIG. 17 shows how the mask 30 is formed. The mask 30 is a three-layer structure composed of a base film 31, an adhesive layer 32 and a separator film 33, arranged in the stated order from the top.

The base film 31 is a flexible resin film formed, for example, of a polyimide. The adhesive layer 32 is a thermosetting adhesive applied on the base film 31 to a predetermined thickness. The separator film 33 attached to the adhesive layer 32 is a film formed of a material peelable from the adhesive layer 32.

The base film 31 is a base for the entire mask 30. The thickness of the base film 31 (the thickness of the base film 31 and the adhesive layer 32 combined to be more strict) is configured to be greater than the thickness of the protective film 40 to be formed (see FIGS. 22A and 22B). The separator film 33 is provided so as to preserver the virginity of the adhesive layer 32.

The mask 30 having the construction described above is cut by a die 35 so as to form openings 34a and 34b. The openings 34a and 34b are formed at positions that correspond to a circuit area 37 described later formed on a wafer 36. The openings 34a and 34b need not be aligned with the circuit area 37 with precision. The openings 34a and 34b should at least be larger than he circuit area 37. Accordingly, the openings 34a and 34b can easily be formed.

Figure 18:
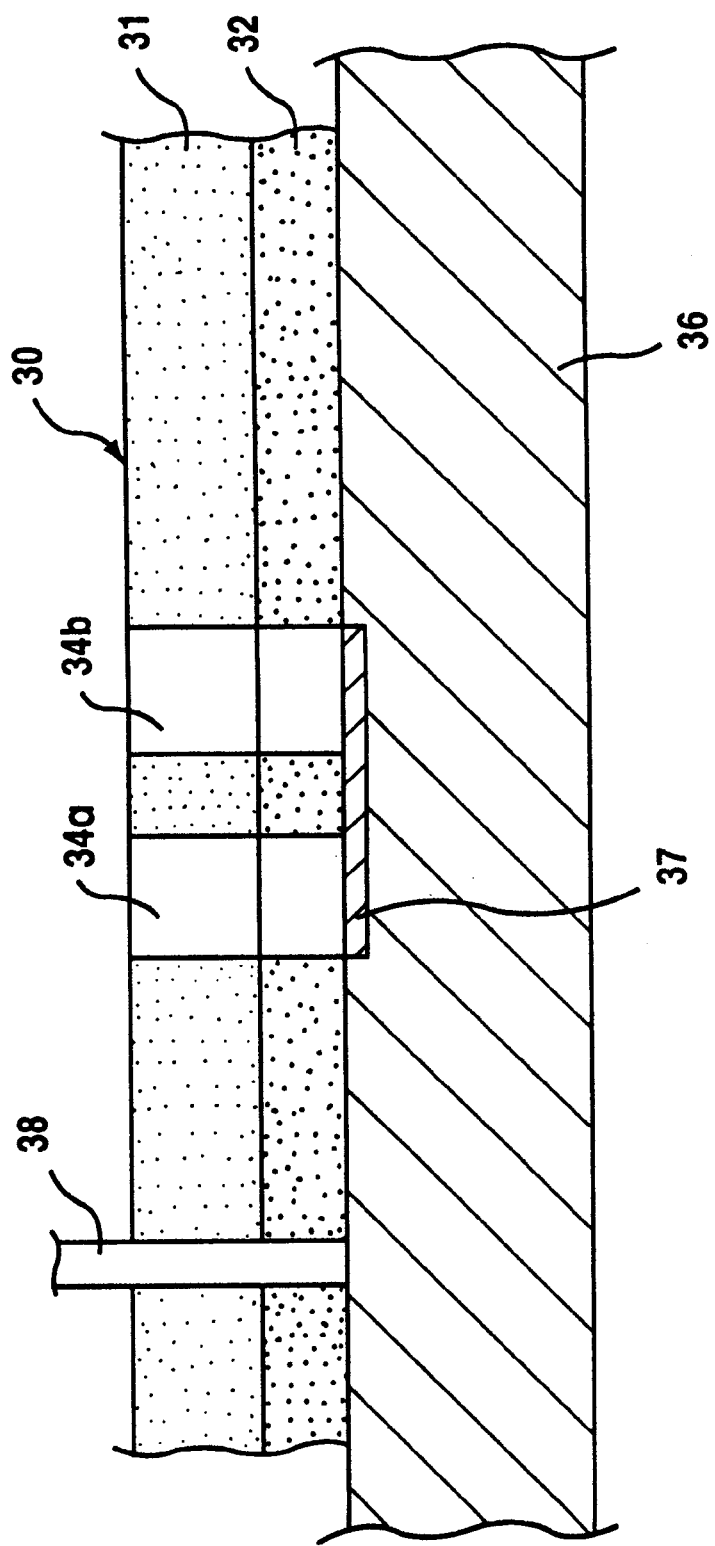
FIG. 18 shows how the mask is attached to a wafer according to the second embodiment.

When the mask 30 has been formed, an adhesion process for attaching the mask 30 to the wafer 36 is performed. FIG. 18 shows how the mask 30 is attached to the wafer 36. In the adhesion process, the separator film 33 is removed from the adhesive layer 32 of the mask 30 so that the adhesive layer 32 is exposed. The mask 30 is then adhesively attached to the wafer 36.

Since the separator 33 provides a protection for the adhesive layer 32 until the instant when the mask 30 is attached to the wafer 36, the adhesive layer 32 is prevented from being hardened before the adhesion. The virginity of the adhesive layer 32 is thus preserved. Accordingly, the mask 30 can be properly attached to the wafer 36.

When the mask 30 is attached to the wafer 36, it is ensured that the openings 34a and 34b formed in the mask 30 are aligned with the circuit area 37 formed on the wafer 36. Positioning of the mask 30 with respect to the wafer 36 is effected using a guide pin 38 as shown in FIG. 18.

In a state in which the mask 30 is adhesively attached to the wafer 36, the wafer 36 is in contact with the adhesive layer 32 which is soft (that is, not yet hardened). Thus, the circuit area 37 and the other areas on the wafer 36 remain undamaged when the mask 30 is provided on the wafer 36. Since the mask 30 is adhesively attached to the wafer 36 via the adhesive layer 32, the mask 30 is prevented from being deviated with respect to the wafer 36 in the processes performed subsequently.

Subsequent to the adhesive attachment of the mask 30 to the wafer 36, a filling process for filling protective film materials 40a and 40b that turn into the protective film 40 in the openings 34a and 34b is performed. In the second embodiment, a thermosetting resin is used as a protective film material 40a and a thermoplastic resin is used as a protective film material 40b.

The protective film materials 40a and 40b are in a liquefied state before the filling process. The protective film materials 40a and 40b have different characteristics. The protective film material 40a may be a material that can be properly joined with the wafer 36. The protective film material 40b may be a material that can be properly joined with a resin that forms the resin package 11.

In the second embodiment, a syringe is used to fill the protective film materials 40a and 40b in the openings 34a and 34b. The syringe 39 is capable of dropping the liquefied protective film materials 40a and 40b and is movable over the mask 30.

Figure 19:
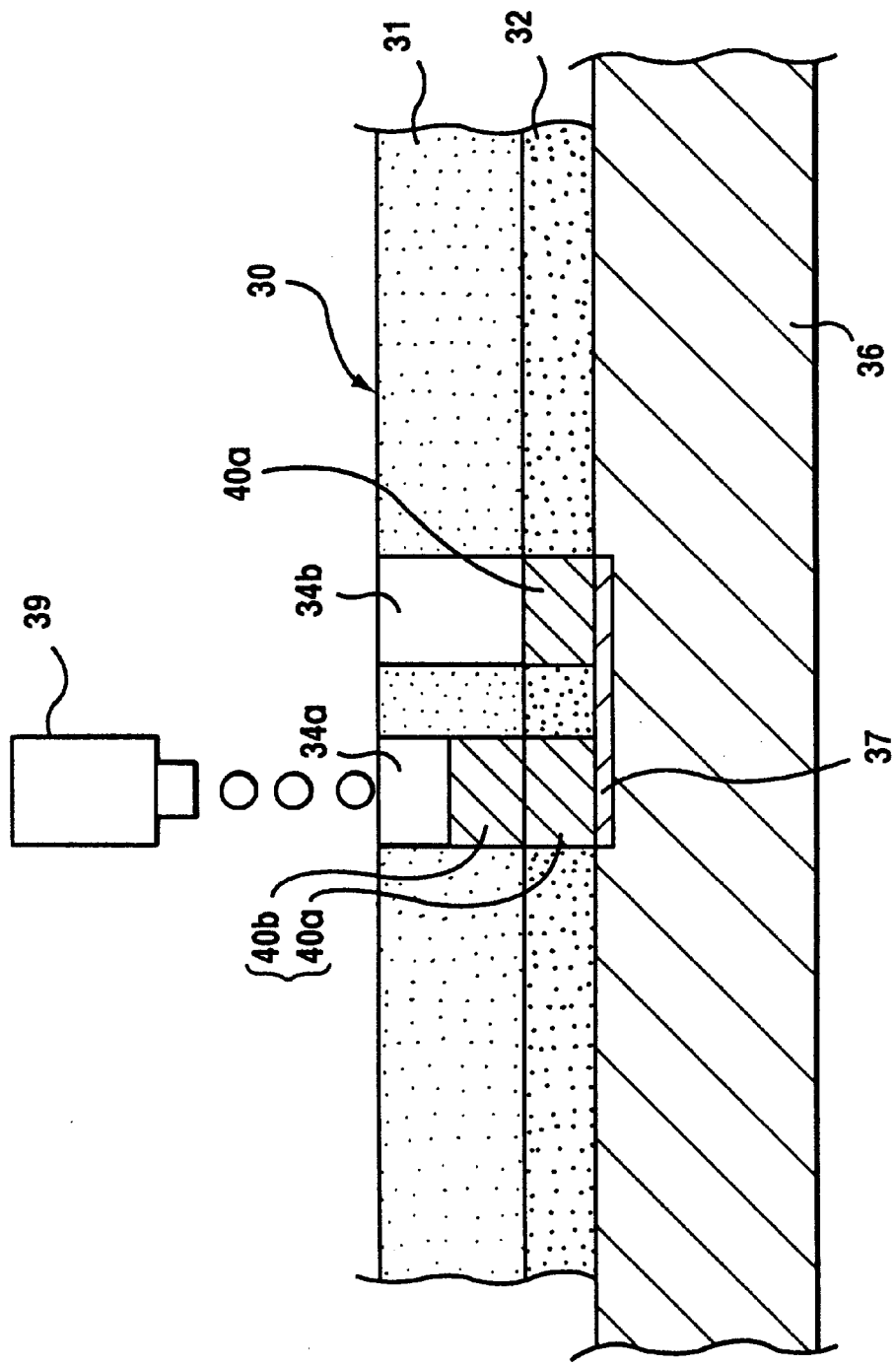
FIG. 19 shows how protective film materials are dropped in openings in a mask according to the second embodiment.

The syringe 39 is moved over the openings 34a and 34b formed in the mask 30 so as to drop the protective film material 40a and then the protective film material 40b. That is, the syringe 39 drops the protective film materials 40a and 40b so that the protective film material 40b is built upon the protective film material 40a in the openings 34a and 34b. FIG. 19 shows the protective film material 40b being dropped in the opening 34a and 34b after the protective film material 40a has been dropped therein.

As described above, by using the liquefied protective film materials 40a and 40b that turn into the protective film 40, and by dropping the protective film materials 40a and 40b on the circuit area 37 on the wafer 36 using the syringe 39, the protective film materials 40a and 40b can be built on the circuit area 37 without causing a stress in the circuit area 37. Thus, the circuit area 37 can be prevented from suffering any damage. Accordingly, it is possible to improve the yield in the semiconductor fabrication and also improve the reliability of the semiconductor devices produced.

While the syringe 39 is used to fill the protective film materials 40a and 40b in the openings 34a and 34b, a spray may be used to fill the liquefied protective film materials 40a and 40b in the openings 34a and 34b such that the spray sprays the protective film materials 40a and 40b to the openings 34a and 34b.

Figure 20:
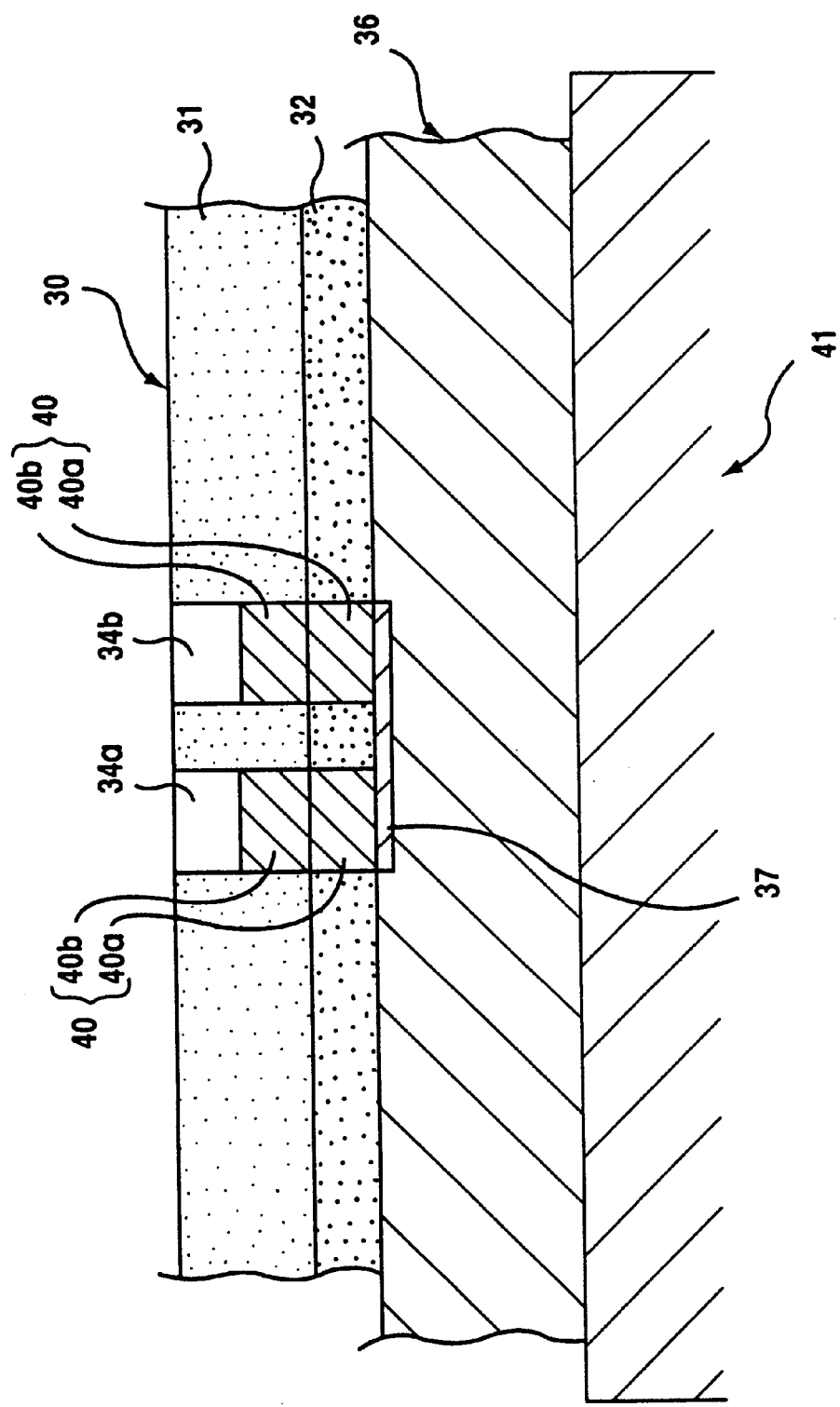
FIG. 20 shows how protective film materials are hardened according to the second embodiment.

When the protective film materials 40a and 40b have filled the openings 34a and 34b formed in the mask 30, a hardening process for hardening the protective film materials 40a and 40b is performed. As shown in FIG. 20, in order to harden the protective film materials 40a and 40b, the wafer 36 on which the protective film materials 40a and 40b are provided is placed on a heat block 41 so that the protective film materials 40a and 40b are subject to a heating process.

As described before, since the protective film material 40a is formed of a thermosetting resin, the liquefied protective film material 40a is hardened as a result of the heating process. The thermoplastic protective film material 40*b* is hardened to a certain degree but retains a certain adhesiveness without being completely hardened. By applying heat to the protective film materials 40*a* and 40*b*, the protective film 40 is formed.

Means to apply heat to the protective film materials 40*a* and 40*b* is not limited to the heat block 41. For example, a furnace may be used such that the wafer 36 on which the protective film materials 40*a* and 40*b* are provided is mounted on the furnace so that the heating process is effected.

When the protective film materials 40*a* and 40*b* have been hardened to form the protective film 40, the mask 30 is peeled from the wafer 36. Since the adhesive layer 32 is formed of an adhesive peelable from the wafer 36, it is easy to peel the mask 30 from the wafer 36.

FIG. 21 shows a state in which the mask 30 is peeled from the wafer 36. Referring to FIG. 21, the protective film 40 remains in the wafer 36 when the mask 30 has been peeled from the wafer 36. The circuit area 37 formed on the wafer 36 remains protected by the protective film 40.

Figure 22A:
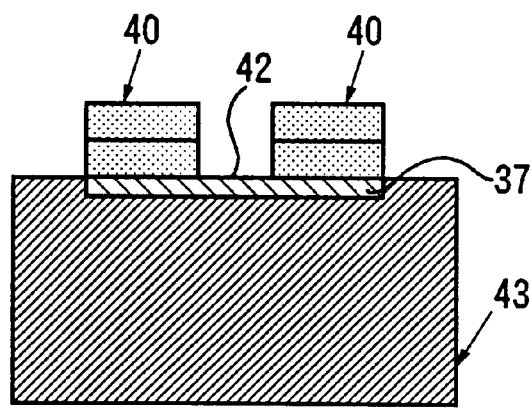
FIGS. 22A and 22B show a semiconductor chip fabricated according to the second embodiment.
Figure 22B:
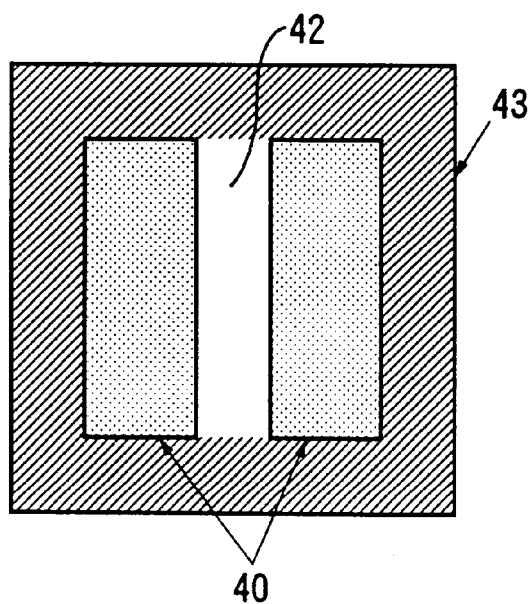

When the mask 30 is peeled from the wafer 36, the wafer 36 is subject to a scribing process so that the individual semiconductor chips 43 are obtained. The chain line A of FIG. 21 indicates a position of the scribing. FIGS. 22A and 22B show the individual semiconductor chips 43.

According to the second embodiment, a wire fitting part 42 in which the protective film 40 is not formed is provided at the center of the protective film 40 formed on the circuit area 37. The wire fitting part 42 is a portion in which electrode pads (not shown) are formed. Wires are bonded to the electrode pads in a later process. For this reason, the protective film 40 is not formed in the wire fitting part 42.

Figure 23:
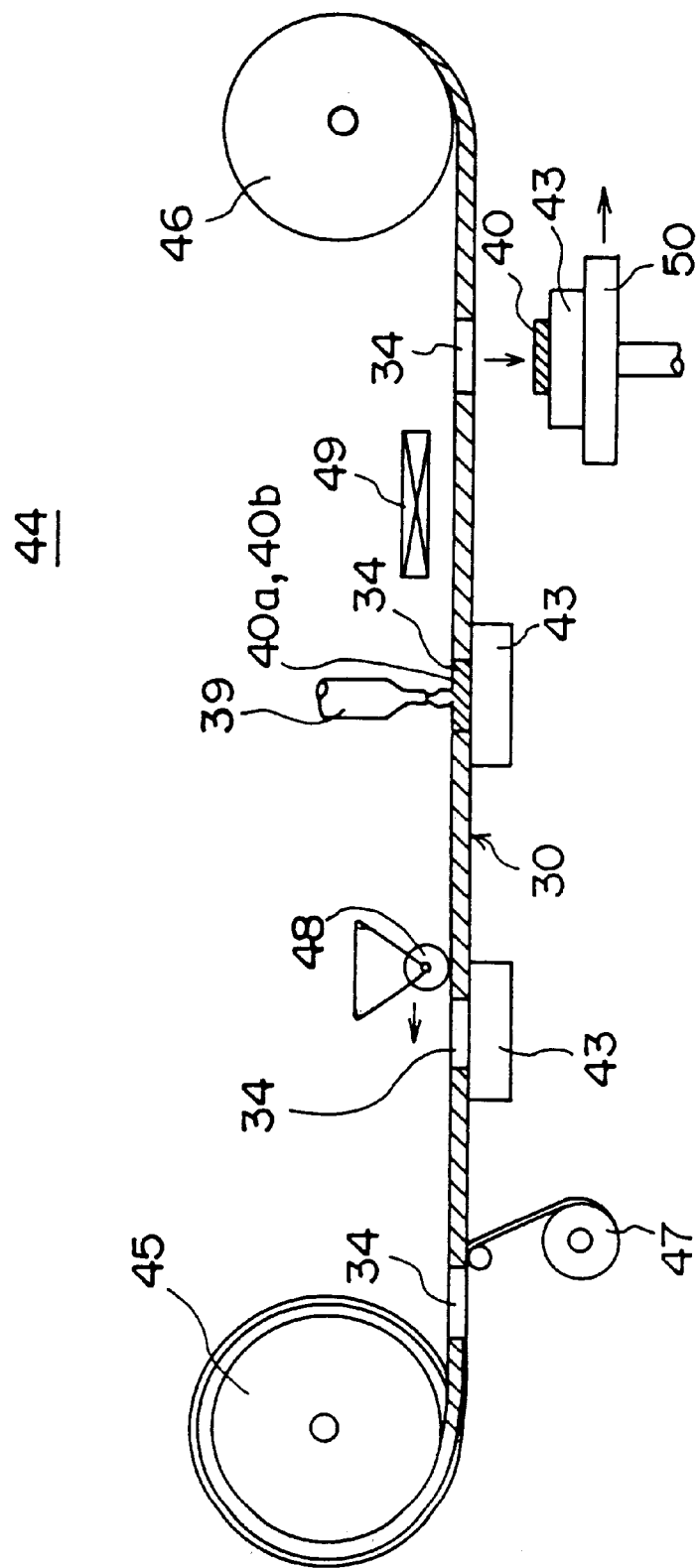
FIG. 23 is a protective film forming device according to the second embodiment.

FIG. 23 is a protective film forming device 44 capable of automatically carrying out the above-described processes for obtaining the semiconductor chip 43. In the protective film forming device 44, the mask 30 is made to travel from a supply reel 45 to a take-up reel 46. While the mask 30 travels, the protective film 40 is formed. A description will be given below of how the protective film is formed with reference to the travel of the mask 30.

The mask 30 on which the separator film 33 shown in FIG. 17 is attached is wound around the supply reel 45. The mask 30 is provided with an opening 34 at a position that corresponds to a circuit area (not shown) formed on the semiconductor chip 43.

The separator film 33 is peeled from the mask 30 fed from the supply reel 45 and the separator film 33 peeled is retrieved by being wound around a peel pulley 47. Thus, the separator 33 is reusable so that the cost of forming the protective film 40 can be reduced.

Subsequently, the semiconductor chip 43 is attached to the mask 30 on which the adhesive layer 32 is exposed by removing the separator film 33, using a chip attaching device not shown (in the second embodiment, each semiconductor chip 43 obtained as a result of a scribing process is attached to the mask 30). The semiconductor chip 43 is attached to the mask 30 such that the circuit area 37 formed on the semiconductor chip 43 faces the opening 34.

A rubber roller 48 is provided above the mask 30 for pressing the mask 30 against the semiconductor chip 43 so as to ensure that the semiconductor chip 43 is properly attached to the mask 30. It is to be noted that the adhesive layer 32 is softened and that a rubber material forming the rubber 48 is also relatively soft. Consequently, the circuit area 37 formed on the semiconductor chip 43 is prevented from being damaged when the rubber roller 48 presses the mask 30 against the semiconductor chip 43.

When the semiconductor chip 43 has been attached to the mask 30, the mask 30 travels further so that the semiconductor chip 43 is transported to a position below the syringe 34. When the semiconductor chip 43 is transported to a position that faces the syringe 39, the liquefied protective film materials 40*a* and 40*b* are dropped by the syringe 39 so as to fill the opening 34.

When the protective film materials 40*a* and 40*b* have filled the opening 34, the mask 30 travels to enter a heater 49, where the protective film materials 40*a* and 40*b* are subjected to the hardening process. As a result of this, the protective film 40 is formed on the circuit area 37 on the semiconductor chip 43. As described before, the protective film material 40*b* retains a certain adhesiveness.

When the thermosetting of the protective film materials 40*a* and 40*b* is completed so that the protective film 40 is formed on the circuit area 37, the semiconductor 43 travels to a position at which a chip removing jig (hereinafter, referred to as a jig) 50 prompted by the travel of the mask 30. The jig 50 peels from the mask 30 the semiconductor chip 43 on which the protective film 40 has bee formed. The mask 30 from which the semiconductor chip 43 is removed is taken up by the take-up reel 46.

According to the protective film forming device 44 having the above-described construction, the process for providing the liquefied protective film materials 40*a* and 40*b*, the process for forming the protective film 40 by applying a heat, and the process for peeling the semiconductor chip 43 from the mask 30 can be executed in a sequential manner. Therefore, it is possible to form the protective film 40 on the semiconductor chip 43 more efficiently than when the individual processes are performed separately, thus providing an efficient method for fabricating the semiconductor device.

When the protective film 40 has bee formed on the circuit area 37 on the semiconductor chip 43 by the method described with reference to FIGS. 17 through 22B or using the protective film forming device 44 shown in FIG. 23, leads are provided on the semiconductor chip 43. The leads are formed in a lead forming process separate from the protective film forming process describe above.

In the lead forming process, a frame base is punched using a lead frame die. As a result of the punching, the lead frame (not shown) provided with the leads is produced. The leads provided in the lead frame are secured to the semiconductor chip 43 via the protective film 40 (more specifically, the protective film material 40*b*) formed on the semiconductor chip 43. In this way, the semiconductor chip 43 is secured to the lead frame.

Wires 15 are provided by wire bonding between the leads and the electrode pads formed on the wire fitting part 42 (on which the protective film 40 is not formed) on the semiconductor chip 43. Subsequently, the resin package 11 is formed by a molding process. Unnecessary lead frame portions located outside the resin package 11 are removed and the outer leads are formed to have, for example, a gull-wing configuration. Thus, the semiconductor devices 10A, 10B and 10C as shown in FIGS. 24, 25 and 26, respectively are produced.

Figure 24:
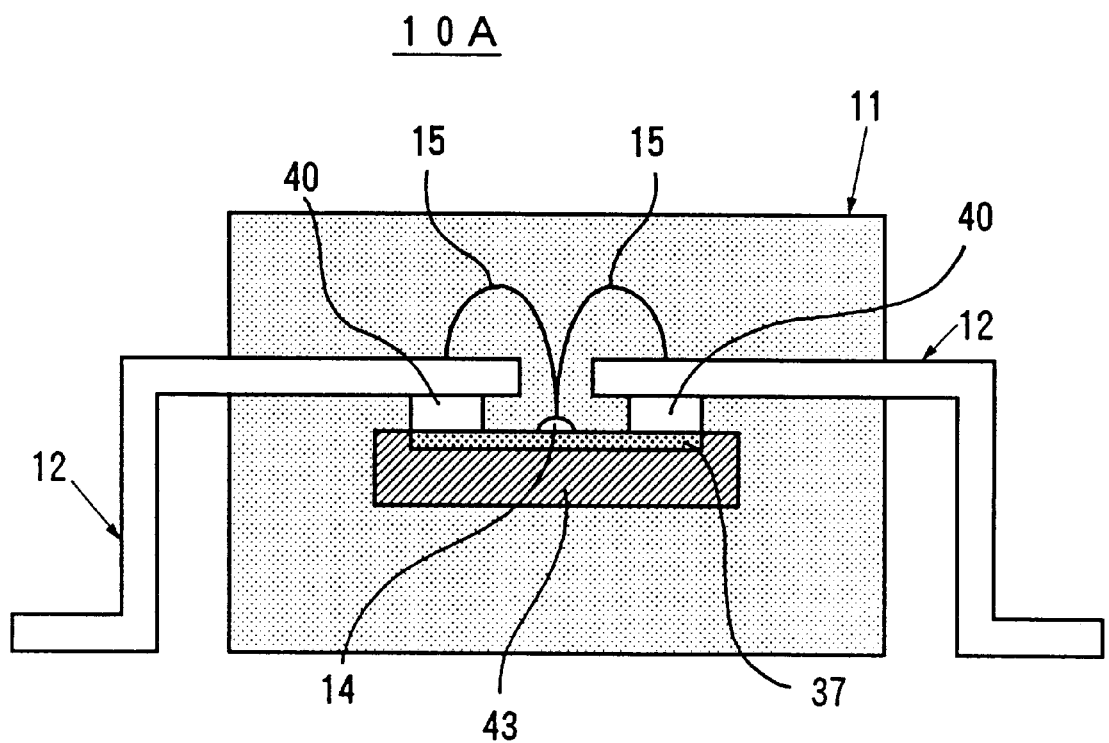
FIG. 24 shows a semiconductor device to which the second embodiment is applied.

FIG. 24 shows the semiconductor device 10A of the LOC construction to which the second embodiment is applied. In the semiconductor device 10A, the protective film 40 is used as an adhesive. The semiconductor device 10A is produced such that the semiconductor chip 43 is adhesively attached to the leads 12 by the protective film 40, the wires 15 are provided and then the resin package 11 is formed.

Figure 25:
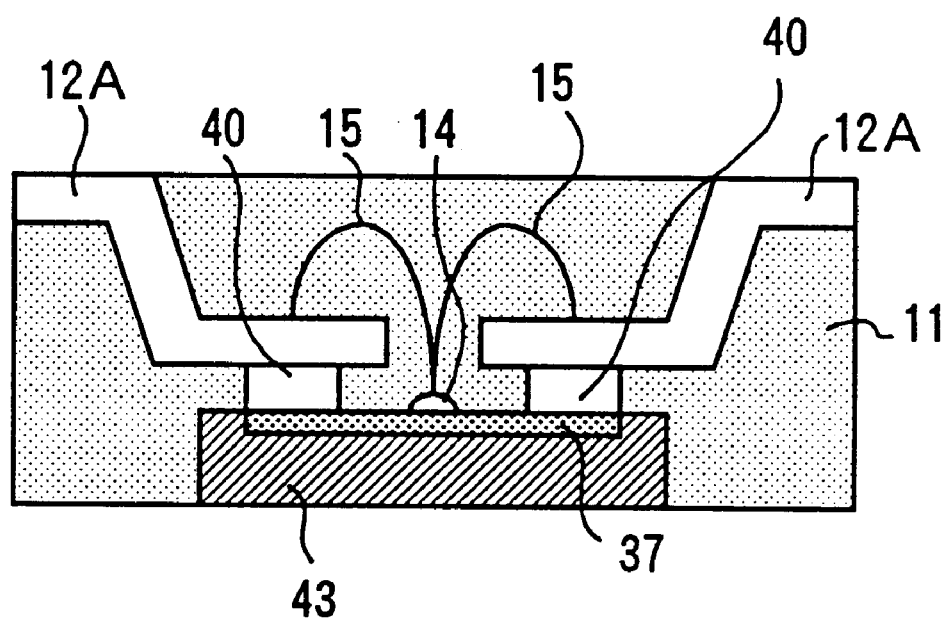
FIG. 25 shows another semiconductor device to which the second embodiment is applied.
Figure 26:
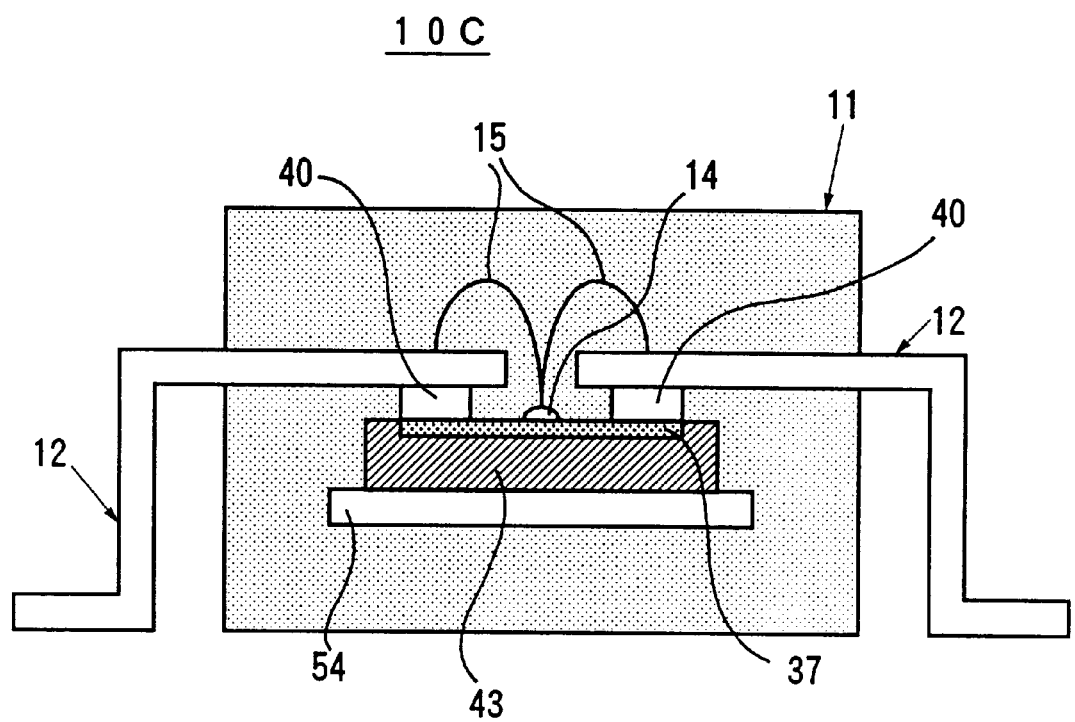
FIG. 26 shows still another semiconductor device to which the second embodiment is applied.

FIG. 25 shows the semiconductor device 10B of a Single Outline Nonlead (SOC) construction to which the second embodiment is applied. In the SOC semiconductor device 10B, leads 12A do not extend outside the resin package 11. Instead, portions of the leads 12A are exposed on the resin package 11 so as to function as external connection terminals.

Since the leads 12A do not extend outside the resin package 11, the semiconductor device 10B can have a reduced size. The semiconductor device 10B also uses the protective film 40 as an adhesive. Therefore, the semiconductor device 10B is produced such that the semiconductor chip 43 is adhesively attached to the leads 12 by the protective film 40, the wires 15 are provided and then the resin package 11 is formed.

In the semiconductor device 10C shown in FIG. 26, the semiconductor chip 43 is sandwiched between the leads 12 above and a stage 54 below. Since the semiconductor chip 43 is held between the leads 12 and the stage 54, the protective film 40 need not have an adhesiveness.

The semiconductor devices 10A–10C can be fabricated by employing the fabrication method of the second embodiment. According to the fabrication method of the second embodiment, the protective film 40 is formed on the circuit area 37 on the semiconductor chip 43 before the semiconductor chip 43 is fixed to the leads 12 or 12A.

Since the semiconductor chip 43 is secured to the leads 12 or 12A via the protective film 40, the leads 12 or 12A are prevented from accidentally coming into contact with the circuit area 37 when the semiconductor chip 43 is joined with the leads 12 or 12A. Accordingly, the yield of the semiconductor devices 10A, 10B and 10C is improved.

The second embodiment may be applied not only to the fabrication of the semiconductor devices 10A–10C but also to the fabrication of semiconductor devices of other constructions.

A description will now be given of a third embodiment of the present invention.

Figure 27:
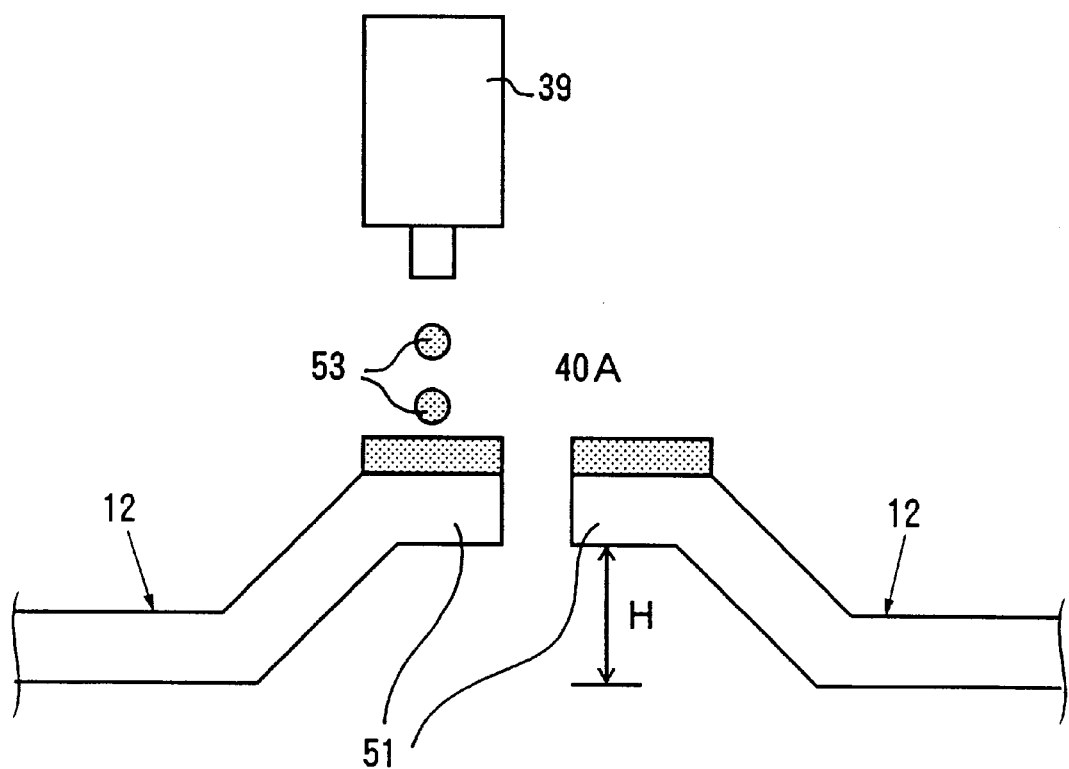
FIG. 27 shows a method of providing a protective film material on leads according to a third embodiment.
Figure 28:
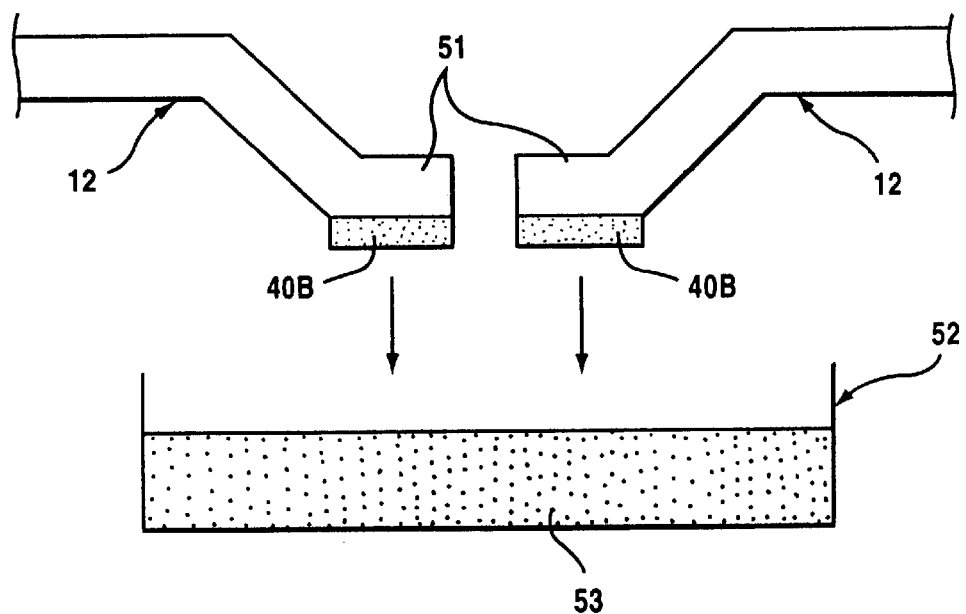
FIG. 28 shows another method of providing a protective film on leads according to the third embodiment.
Figure 29:
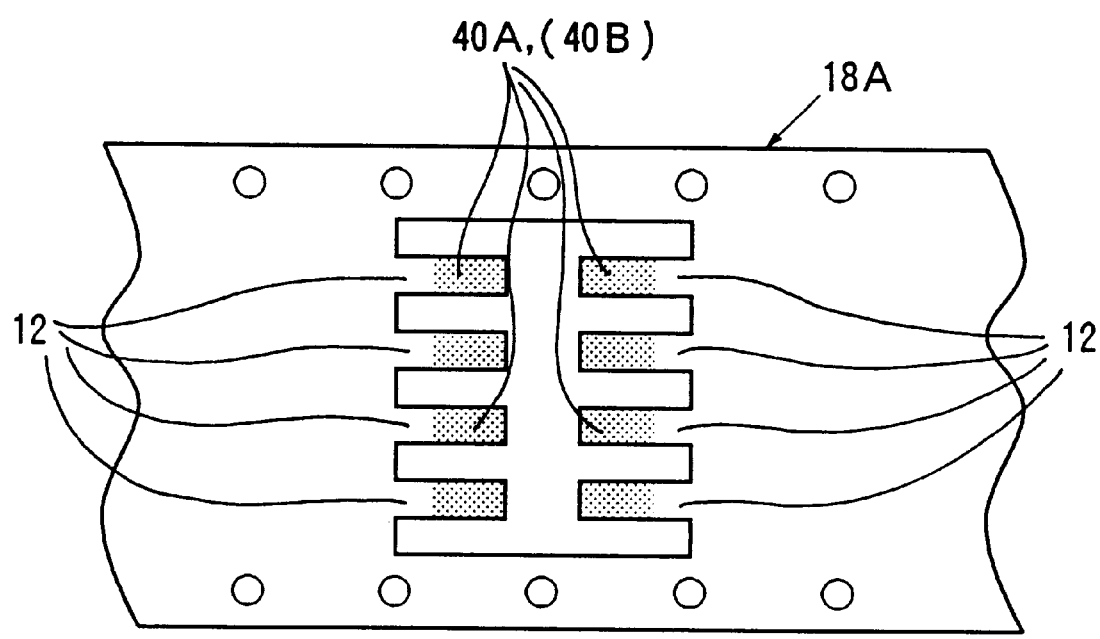
FIG. 29 shows a lead frame produced according to the third embodiment.

FIGS. 27 through 29 show a semiconductor fabrication method according to a third embodiment. In FIGS. 27 through 29, those components that correspond to the components of the first and second embodiments described with reference to FIGS. 1A through 23 are designated by the same reference numerals.

In the semiconductor fabrication method according to the second embodiment, the protective film 40 is provided on the circuit area 37 formed on the semiconductor chip 43. A feature of the fabrication method according to the third embodiment is that the protective film 40 is provided on the leads 12.

In the example shown in FIG. 27, a protective film material 53 is provided directly on the leads 12 using the syringe 39. Each of the leads 12 used in the third embodiment has a semiconductor chip fitting part (hereinafter, referred to as a down-setting part 51) which faces the semiconductor chip 43. The down-setting part 51 of each of the leads 12 is configured to project toward the semiconductor chip 43 by the dimension H as indicated in FIG. 27 with respect to the other portions of the lead 12. The protective film material 53 is provided on the down-setting part 51 using the syringe 39.

Since the down-setting parts 51 of each of the leads 12 are formed with a pitch that corresponds to a pitch of the electrode pads formed on the semiconductor chip 43, each down-setting part 51 is relatively narrow. When the liquefied protective film material 53 is dropped by the syringe 39 to the down-setting part 51, the protective film material 53 is provided properly on the down-setting part 51 according to a capillary action. Subsequently, the protective film material 53 provided in the down-setting part 51 is heated so as to be hardened. Thus, a protective film 40A is formed.

FIG. 28 shows another method of providing the protective film material 53 directly on the leads 12. While FIG. 27 shows the method whereby the protective film material 53 is provided on the down-setting part 51 using the syringe 39, the method according to the third embodiment uses a protective film material tank 52 filled by the protective film material 53. By steeping the down-setting part 51 of the leads 12 in the protective film material tank 52, the protective film material 53 is provided on the down-setting part 51. When the protective film material 53 is hardened by heating, a protective film 40B is formed. FIG. 28 shows a lead frame 18 in which the protective film 40A or 40B is formed on the down-setting part 51 of the leads 12.

As described above, the protective film 40A or 40B is provided on the down-setting part 51 of the leads 12 that faces the semiconductor chip 43, before the semiconductor chip 43 is fixed to the leads 12. Subsequently, the semiconductor chip 43 is fixed on the down-setting part 51 of the leads 12 by the protective film 40A or 40B which also functions as an adhesive. Accordingly, the down-setting part 51 secures the semiconductor chip 43 to itself via the protective film 40A or 40B. In this way, the leads 12 (the down-setting part 51) are prevented from accidentally coming into contact with the circuit area 37 of the semiconductor chip 43 when the semiconductor chip 43 is joined with the leads 12. Accordingly, the yield in the semiconductor fabrication is improved.

Of particular note is that, according to the method shown in 28, the protective film 40B can be formed easily by a simple process in which the down-setting part 51 of the leads 12 is steeped in the protective film material tank 52 filled by the liquefied protective film material 53.

Further, in the third embodiment, the protective film 40A or 40B is formed only on those portions of the leads 12 to which the semiconductor chip 43 is fixed, by forming the down-setting part 51 in each of the leads 12 and providing the protective film 40A or 40B on the down-setting part 51. In this way, the wasteful use of the protective film material 53 is prevented, and the semiconductor chip 43 is properly secured to the leads 12 (down-setting part 51).

What is claimed is:

1. A method of fabricating a semiconductor device comprising the steps of:

forming a lead frame by subjecting a base to a forming process;

fixing a semiconductor chip on leads formed in the lead frame and providing wires in the semiconductor chip; and forming a package which accommodates the semiconductor chip, wherein a non-conductive adhesive is provided, before said forming process, on a position on said base in which the leads are formed, and unnecessary portions of said base and said non-conductive adhesive are removed in the forming process so that the leads having a predetermined configuration and provided with said non-conductive adhesive are formed, wherein the leads are mounted on and adhered to the non-conductive adhesive formed on the semiconductor chip.

2. The method of fabricating a semiconductor device as claimed in claim 1, wherein said non-conductive adhesive is provided in a position in which ends of the leads are formed so that the adhesive remains selectively on the ends of the leads after the leads have been formed.

3. The method of fabricating a semiconductor device as claimed in claim 1, wherein the unnecessary portions of said base are removed by one of a pressing process and an etching process.

4. A method of fabricating a semiconductor device comprising the steps of:

forming a lead frame by subjecting a base to a forming process;

fixing a semiconductor chip on leads formed in the lead frame and providing wires in the semiconductor chip; and forming a package which accommodates the semiconductor chip, wherein an adhesive is formed at least in a circuit area of said semiconductor chip on which a circuit is formed, and, subsequently, said semiconductor chip is fixed to said leads via said an adhesive.

5. The method of fabricating a semiconductor device as claimed in claim 4, wherein said adhesive is formed by a method comprising the steps of:

forming, on said circuit area on said semiconductor chip, a mask provided with openings that correspond to said circuit area;

providing liquefied adhesive material in the openings provided in said mask;

forming said adhesive by hardening said adhesive material; and removing said mask from said semiconductor chip.

6. The method of fabricating a semiconductor device as claimed in claim 4, wherein said mask is a multilayer mask comprising a base film, an adhesive layer, a separator film arranged in a stated order from a top.

7. The method of fabricating a semiconductor device as claimed in claim 4, wherein said adhesive material is provided in said openings using one of a dispenser and a spray.

8. The method of fabricating a semiconductor device as claimed in claim 5, wherein said mask is made to travel from a supply reel to a take-up reel, and following three processes are performed sequentially,
a) a process for providing said liquefied adhesive material in said openings as the mask travels;
b) a process for forming said adhesive; and
c) a process of removing said mask from said semiconductor chip.

9. A method of fabricating a semiconductor device comprising the steps of:

forming a lead frame by subjecting a base to a forming process;

fixing a semiconductor chip on leads formed in the lead frame and providing wires in the semiconductor chip; and forming a package which accommodates the semiconductor chip, wherein a adhesive is formed at least in an area of said leads which faces said semiconductor chip and, subsequently, said semiconductor chip is fixed to said leads via said adhesive.

10. The method of fabricating a semiconductor device as claimed in claim 9, wherein said adhesive is provided on said leads by steeping said leads in a adhesive material tank filled by a liquefied adhesive material.

11. The method of fabricating a semiconductor device as claimed in claim 9, wherein a down-setting part is provided in each of said leads so that said adhesive is formed in said down-setting part.

* * * * *